(12) United States Patent
Kim et al.

(10) Patent No.: US 11,460,967 B2
(45) Date of Patent: Oct. 4, 2022

(54) ELECTRONIC DEVICE

(71) Applicant: Samsung Display Co., Ltd., Yongin-si (KR)

(72) Inventors: Minsoo Kim, Seoul (KR); Jaeuk Choi, Seoul (KR); Yun-Ho Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/210,753

(22) Filed: Mar. 24, 2021

(65) Prior Publication Data

US 2021/0405818 A1    Dec. 30, 2021

(30) Foreign Application Priority Data

Jun. 30, 2020   (KR) .................. 10-2020-0080471

(51) Int. Cl.
*G06F 3/044* (2006.01)
*G06F 3/041* (2006.01)
*H01L 27/32* (2006.01)

(52) U.S. Cl.
CPC .......... *G06F 3/0446* (2019.05); *G06F 3/0412* (2013.01); *G06F 3/0448* (2019.05); *H01L 27/323* (2013.01); *G06F 2203/04111* (2013.01); *G06F 2203/04112* (2013.01)

(58) Field of Classification Search
None
See application file for complete search history.

(56) References Cited

U.S. PATENT DOCUMENTS

| | | |
|---|---|---|
| 8,947,370 B2 | 2/2015 | An et al. |
| 10,353,498 B2 | 7/2019 | Feng |
| 10,572,086 B2 | 2/2020 | Na et al. |
| 2011/0025639 A1 | 2/2011 | Trend et al. |
| 2013/0127775 A1* | 5/2013 | Yilmaz ................. G06F 3/0446 200/600 |
| 2014/0002415 A1 | 1/2014 | Wang |
| 2018/0224964 A1* | 8/2018 | Church ................. G06F 3/047 |
| 2018/0232070 A1 | 8/2018 | Katsurahira |
| 2019/0064960 A1 | 2/2019 | Na et al. |

FOREIGN PATENT DOCUMENTS

| | | |
|---|---|---|
| KR | 10-1726623 B1 | 4/2017 |
| KR | 10-1853037 B1 | 4/2018 |
| KR | 10-2019-0025096 A | 3/2019 |

* cited by examiner

*Primary Examiner* — Carl Adams
(74) *Attorney, Agent, or Firm* — Lewis Roca Rothgerber Christie LLP

(57) ABSTRACT

An electronic device including a display layer and a sensor layer including a plurality of sensing units. Each of the plurality of sensing units includes at least one sub sensing unit. The at least one sub sensing unit includes a first pattern including a first portion and a second portion, a first cross pattern including a first cross portion and a second cross portion, a second cross pattern, and a bridge pattern. The second portion extends in a first cross direction crossing the first direction and a second direction crossing the first direction to face the first cross portion, and the second cross portion extends in the first cross direction to face the first portion.

25 Claims, 19 Drawing Sheets

ELECTRONIC DEVICE

CROSS-REFERENCE TO RELATED APPLICATION

This application claims priority to and the benefit of Korean Patent Application No. 10-2020-0080471, filed on Jun. 30, 2020, the entire contents of which are hereby incorporated by reference.

BACKGROUND

Aspects of some embodiments of the present disclosure herein relate to an electric device having improved sensing reliability.

Electronic devices may sense an external input applied from the outside of the electronic devices. The external input may be a user's input. The user's input may include various types of external inputs such as a portion of user's body, light, heat, a pen, a pressure, or the like. The electronic devices may recognize coordinates of the pen using an electromagnetic resonance (EMR) method or may recognize the coordinates of the pen using an active electrostatic (AES) method.

The above information disclosed in this Background section is only for enhancement of understanding of the background and therefore the information discussed in this Background section does not necessarily constitute prior art.

SUMMARY

Aspects of some embodiments of the present disclosure include an electric device having relatively improved sensing reliability.

According to some embodiments of the inventive concept, an electronic device includes: a display layer; and a sensor layer on the display layer, on which an active area and a peripheral area adjacent to the active area are defined, and which includes a plurality of sensing units on the active area and a plurality of lines on the peripheral area. According to some embodiments, each of the plurality of sensing units includes at least one sub sensing unit, the at least one sub sensing unit may include: a first pattern including a first portion and a second portion protruding from the first portion; a first cross pattern including a first cross portion and a second cross portion protruding from the first cross portion; a second cross pattern spaced apart from the first cross pattern with the first portion therebetween; and a bridge pattern electrically connected to the first cross pattern and the second cross pattern and cross to be insulated from the first portion, the first portion may extend in a first direction, the first cross portion may extend in a second direction crossing the first direction, the second portion may extend in a first cross direction crossing the first direction and the second direction to face the first cross portion, and the second cross portion may extend in the first cross direction to face the first portion.

According to some embodiments, the plurality of second portions may surround the plurality of second cross portions, respectively.

According to some embodiments, the first pattern may have a shape in which a shape symmetrical with respect to a first axis extending in the first direction is symmetrical with a second axis extending in the second direction, the first cross pattern may have a shape symmetrical with respect to the second axis, and the first cross pattern and the second cross pattern may have shapes symmetrical to each other with respect to the first axis.

According to some embodiments, the first pattern may further include a third portion protruding from the first portion in the second direction, and the second portion may further include: a first branch portion adjacent to the first portion and extending in the second direction; a second branch portion adjacent to the first branch portion and extending in the first cross direction; and a third branch portion adjacent to the second branch portion, facing the first cross portion, and extending in the first direction.

According to some embodiments, the second cross portion may be between the second portion and the third portion.

According to some embodiments, the first cross pattern may further include a third cross portion protruding from the first cross portion in the first direction, and the second cross portion may include: a first cross branch portion adjacent to the first cross portion and extending in the first direction; a second cross branch portion adjacent to the first cross branch portion and extending in the first cross direction; and a third cross branch portion adjacent to the second cross branch portion, facing the first portion, and extending in the second direction.

According to some embodiments, the second portion may be between the second cross portion and the third cross portion.

According to some embodiments, the first pattern may further include a third portion spaced apart from the second portion with the first cross pattern therebetween and protruding from the first portion, the second portion may include: a first branch portion adjacent to the first portion and extending in the second direction; a second branch portion adjacent to the first branch portion and extending in the first cross direction; and a third portion adjacent to the second branch portion, facing the first cross portion, and extending in the first direction, and the third portion may include: a fourth branch portion adjacent to the first portion and extending in the second direction; a fifth branch portion adjacent to the fourth branch portion and extending in a second cross direction crossing the first cross direction; and a sixth adjacent to the fifth branch portion and extending in the first direction.

According to some embodiments, the first cross pattern may further include a third cross portion protruding from the first cross portion, and the second portion may surround the second cross portion, and the third cross portion may surround the third portion.

According to some embodiments, the first pattern may have a shape symmetrical with respect to a first axis extending in the first direction, and the first cross pattern and the second cross pattern may have shapes symmetrical to each other with respect to the first axis.

According to some embodiments, the first pattern may have a shape that is point symmetrical with respect to a first point at which a first axis extending in the first direction and a second axis extending in the second direction cross each other, and the first cross pattern and the second cross pattern may have shape symmetrical to each other with respect to the first point.

According to some embodiments, the first pattern may further include a third portion spaced apart from the second portion with the first pattern therebetween and protruding from the first portion, the second portion may include: a first branch portion adjacent to the first portion and extending in the second direction; a second branch portion adjacent to the first branch portion and extending in the first cross direction; and a third portion adjacent to the second branch portion and extending in the first direction, and the third portion may include: a fourth branch portion adjacent to the first portion and extending in the second direction; a fifth branch portion adjacent to the fourth branch portion and extending in a second cross direction crossing the first cross direction; and a sixth adjacent to the fifth branch portion and extending in the first direction.

According to some embodiments, the second cross pattern may include a third cross portion extending in the second direction and spaced apart from the first cross portion with the first portion therebetween and a fourth cross portion protruding from the third cross portion, and the second cross portion may surround the second portion, and the third portion may surround the fourth cross portion.

According to some embodiments, each of the first pattern, the first cross pattern, and the second cross pattern may have a shape symmetrical with respect to a second axis extending in the second direction.

According to some embodiments, the first pattern may have a shape that is point symmetrical with respect to a first point at which a first axis extending in the first direction and a second axis extending in the second direction cross each other, and the first cross pattern and the second cross pattern may have shapes symmetrical to each other with respect to the first point.

According to some embodiments, the first pattern, the first cross pattern, the second cross pattern, and the bridge pattern may have a mesh structure.

According to some embodiments, the at least one sub sensing unit may be provided in plurality, and the plurality of lines may include a first line and a second line, which are electrically connected to the plurality of sub sensing units.

According to some embodiments, the first line may be electrically connected to the first pattern, and the second line may be electrically connected to the first cross pattern, the second cross pattern, and the bridge pattern.

According to some embodiments of the inventive concept, an electronic device includes: a display layer; and a sensor layer on the display layer, on which an active area and a peripheral area adjacent to the active area are defined, which includes a plurality of sensing units on the active area and a plurality of lines on the peripheral area, and which senses an input of an input device, wherein each of the plurality of sensing units includes at least one sub sensing unit, the at least one sub sensing unit includes: an electrode including a first portion extending in a first direction and a plurality of second portions protruding from the first portion; and an cross electrode including a plurality of first cross portions extending in a second direction crossing the first direction, a plurality of second cross portions respectively protruding from the plurality of first cross portions, and a bridge pattern cross to be insulated from the first portion and electrically connected to the plurality of cross patterns, each of the plurality of second portions includes: a first branch portion extending in the second direction; a second branch portion extending from the first branch portion and extending in a cross direction crossing the first direction and the second direction; and a third branch portion extending from the second branch portion and extending in the first direction, and the sensor layer senses an input by touch through a change in mutual capacitance generated between the electrode and the cross electrode and senses an input by the input device through a change in capacitance of each of the electrode and the cross electrode.

According to some embodiments, each of the plurality of sensing units may include a plurality of sub sensing units, the plurality of lines may include a first line and a second line, the first line may be electrically connected to each of the plurality of sub sensing units, and the second line may be electrically connected to the cross electrode of each of the plurality of sub sensing units.

According to some embodiments, when viewed on a plane, the outermost portion of an electrode area defined by the plurality of second portions and the plurality of second cross portions may have an octagonal shape.

According to some embodiments, the second branch portion of each of the plurality of second portions may be adjacent to each of the plurality of second cross portions.

According to some embodiments, each of the electrode and the cross electrode may have a shape symmetrical with respect to a first axis extending in the first direction.

According to some embodiments, each of the electrode and the cross electrode may have a shape symmetrical with respect to a second axis extending in the second direction.

According to some embodiments, each of the first electrode and the cross electrode may have a shape that is point symmetrical with respect to a first point at which a first axis extending in the first direction and a second axis extending in the second direction cross each other.

BRIEF DESCRIPTION OF THE FIGURES

The accompanying drawings are included to provide a further understanding of embodiments according to the inventive concept, and are incorporated in and constitute a part of this specification. The drawings illustrate aspects of some embodiments of the inventive concept and, together with the description, serve to explain principles of aspects of embodiments according to the inventive concept. In the drawings.

DETAILED DESCRIPTION

Figure 1:
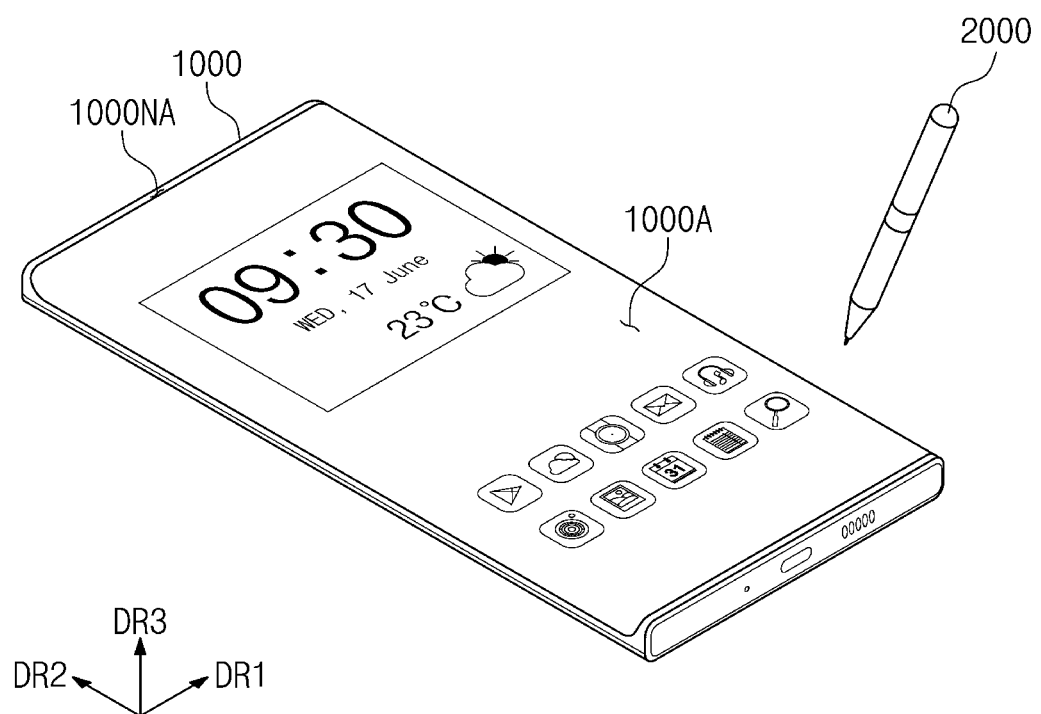
FIG. 1 is a perspective view of an electronic device according to some embodiments of the inventive concept.

In this specification, it will also be understood that when one component (or region, layer, portion) is referred to as being "on", "connected to", or "coupled to" another component, it can be directly located on/connected to/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, aspects of some embodiments of the inventive concept will be described in more detail with reference to the accompanying drawings.

FIG. 1 is a perspective view of an electronic device according to some embodiments of the inventive concept;

Referring to FIG. 1, an electronic device 1000 may be a device that is activated according to an electrical signal. For example, the electronic device 1000 may be a mobile phone, a tablet PC, a car navigation system, a game console, or a wearable device, but embodiments according to the present disclosure are not limited thereto. FIG. 1 illustrates an example in which the electronic device 1000 is a mobile phone.

The electronic device 1000 may display images at an active area 1000A. The active area 1000A may include a surface (e.g., a display surface) defined by a first direction DR1 and a second direction DR2. A thickness direction of the electronic device 1000 may be parallel to a third direction DR3 crossing (e.g., perpendicular or normal with respect to) the first direction DR1 and the second direction DR2. Thus, a front surface (or top surface) and a rear surface (or bottom surface) of each of members constituting the electronic device 1000 may be defined based on the third direction DR3.

An electronic device 1000 may sense inputs applied from the outside thereof. The external inputs may be user's inputs. The user's inputs may include various types of external inputs such as a portion of the user's body, light, heat, or a pressure.

The electronic device 1000 illustrated in FIG. 1 may sense an input by a user's touch and an input by an input device 2000. The input device 2000 may refer to a device other than the user's body. For example, the input device 2000 may be an active pen, a stylus pen, a touch pen, or an electronic pen. Hereinafter, a case in which the input device 2000 is the active pen will be described as an example.

The electronic device 1000 and the input device 2000 may perform bidirectional communication. The electronic device 1000 may provide an uplink signal to the input device 2000. For example, the uplink signal may include a synchronization signal or information of the electronic device 1000, but is not particularly limited thereto. The input device 2000 may provide a downlink signal to the electronic device 1000. The downlink signal may include a synchronization signal or state information of the input device 2000. For example, the downlink signal includes coordinate information of the input device 2000, battery information of the input device 2000, inclination information of the input device 2000, and/or various information stored in the input device 2000, but embodiments according to the present disclosure are not particularly limited thereto.

Figure 2:
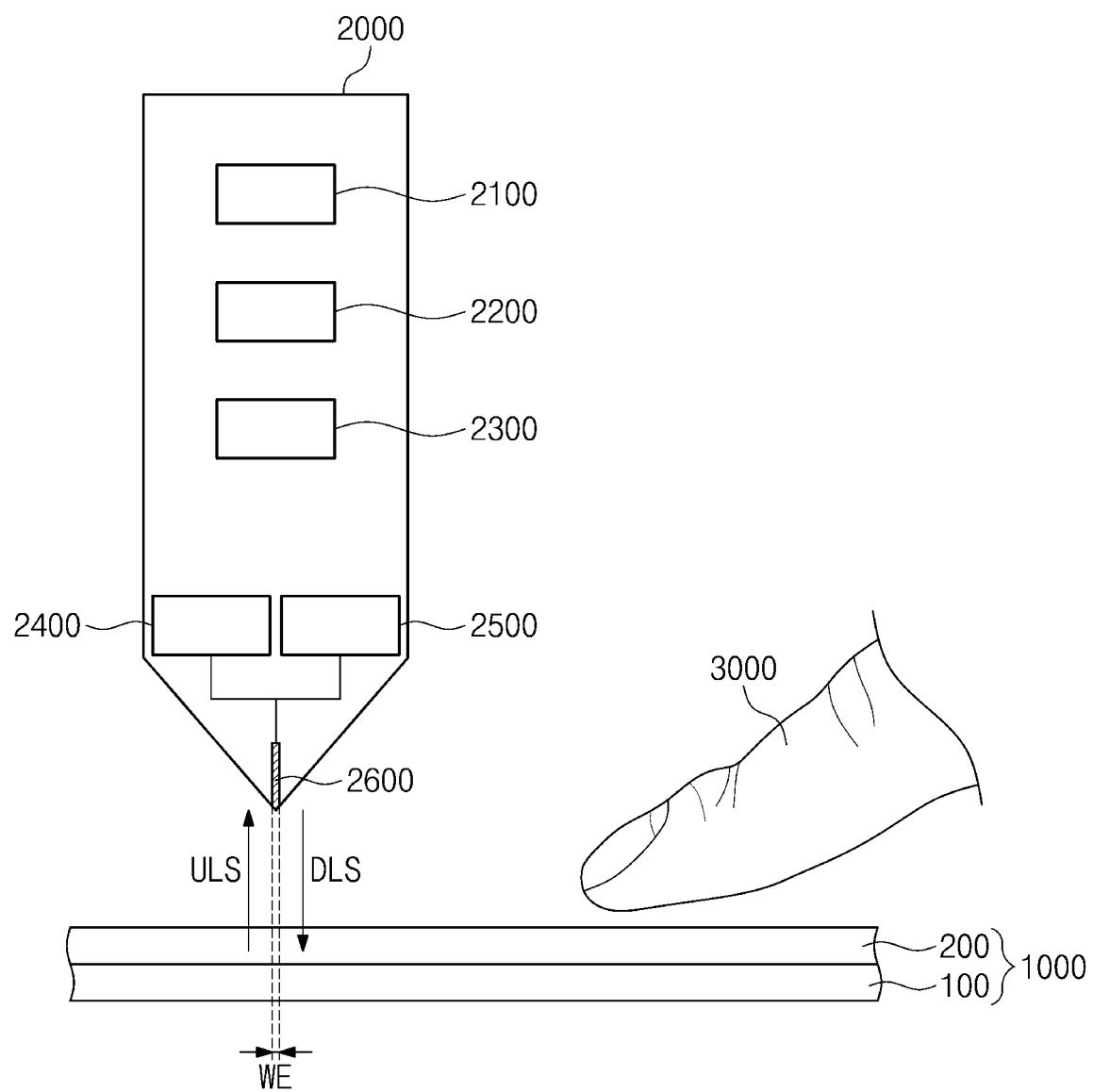
FIG. 2 is a schematic block diagram illustrating the electronic device and an input device according to some embodiments of the inventive concept.

FIG. 2 is a schematic block diagram illustrating the electronic device and the input device according to some embodiments of the inventive concept.

Referring to FIG. 2, the electronic device 1000 may include a display layer 100 and a sensor layer 200.

The display layer 100 may be configured to substantially generate an image. The display layer 100 may be an emission-type display layer. For example, the display layer 100 may be an organic light emitting display layer, a quantum dot display layer, a micro LED display layer, or a nano LED display layer.

The sensor layer 200 may be located on the display layer 100. The sensor layer 200 may sense an external input applied from the outside. The sensor layer 200 may sense both an input by the user's body 3000 and an input by the input device 2000.

The sensor layer 200 may operate by time-division driving. For example, the sensor layer 200 may be driven repeatedly alternately in a first mode and a second mode. The first mode may be a mode for sensing the input by the user's body 3000, and the second mode may be a mode for sensing the input by the input device 2000.

In the second mode, the sensor layer 200 may provide an uplink signal ULS to the input device 2000. When the input device 2000 receives the uplink signal ULS and is synchronized with the electronic device 1000, the input device 2000 may provide a downlink signal DLS to the sensor layer 200.

The input device 2000 may include a power supply 2100, a memory 2200, a control unit 2300, a transmission unit 2400, a reception unit 2500, and a pen electrode 2600. However, components constituting the input device 2000 are not limited to the components listed above. For example, the input device 2000 may further include an electrode switch for converting the pen electrode 2600 to a signal transmission mode or a signal reception mode, a pressure sensor for sensing a pressure, a rotation sensor for sensing rotation, or the like.

The power supply 2100 may include a battery or a high-capacity capacitor that supplies power to the input device 2000. The memory 2200 may store function information of the input device 2000. The control unit 2300 may control an operation of the input device 2000. Each of the transmission unit 2400 and the reception unit 2500 may communicate with the electronic device 1000 through the pen electrode 2600. The transmission unit 2400 may be referred to as a signal generator or a transmission circuit, and the reception unit 2500 may be referred to as a signal receiver or a reception circuit. The sensor layer 200 may acquire the coordinates or inclination of the input device 2000 through the pen electrode 2600. An input area of the pen electrode 2600 may have a first width WE.

Figure 3:
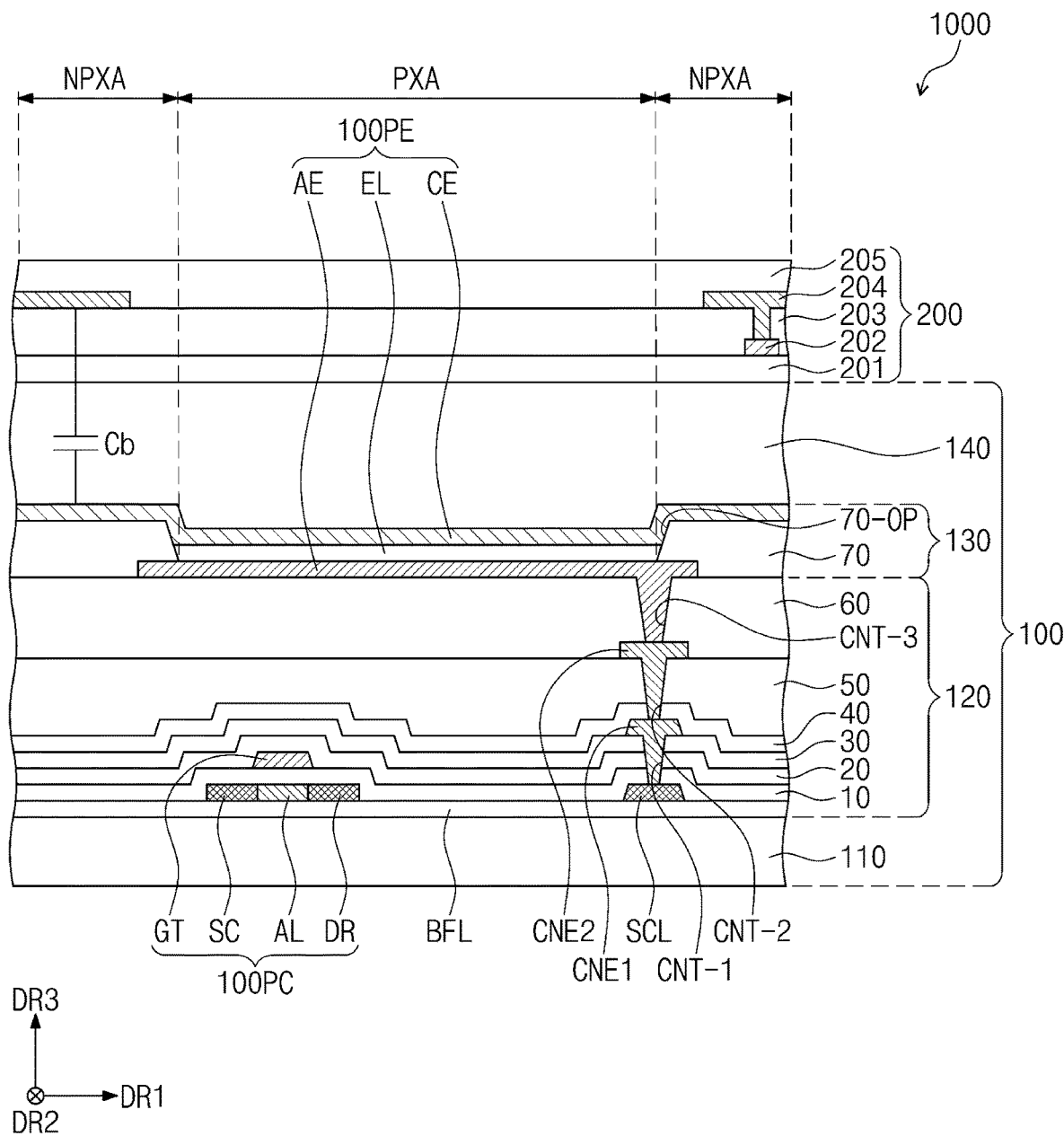
FIG. 3 is a cross-sectional view of the electronic device according to some embodiments of the inventive concept.

FIG. 3 is a cross-sectional view of the electronic device according to some embodiments of the inventive concept;

Referring to FIG. 3, the display layer 100 may include a base layer 110, a circuit layer 120, a light emitting element layer 130, and an encapsulation layer 140.

The base layer 110 may be a member that provides a base surface on which a circuit layer 120 is located. The base layer 110 may be a glass substrate, a metal substrate, or a polymer substrate. However, the base layer 110 according to some embodiments of the inventive concept is not limited thereto. For example, the base layer 110 may be an inorganic layer, an organic layer, or a composite material layer.

The base layer 110 may have a multilayered structure. For example, the base layer 110 includes a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a base barrier layer. Each of the first and second synthetic resin layers may include a polyimide-based resin. Also, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In this specification, the "~~"-based resin means as including a functional group of "~~".

The circuit layer 120 may be located on the base layer 110. The circuit layer 120 may include an insulating layer, a semiconductor pattern, a conductive pattern, and a signal line. The insulating layer, the semiconductor layer, and the conductive layer may be formed on the base layer 110 in a manner such as coating or vapor deposition, and then, the insulating layer, the semiconductor layer, and the conductive layer may be selectively patterned through a plurality of photolithography processes. Thereafter, the semiconductor pattern, the conductive pattern, and the signal line included in the circuit layer 120 may be provided.

At least one inorganic layer may be located on a top surface of the base layer 110. The inorganic layer may include at least one of aluminum oxide, titanium oxide, silicon oxide silicon oxynitride, zirconium oxide, or hafnium oxide. The inorganic layer may be provided as a multilayer. The multilayered inorganic layer may constitute a barrier layer and/or a buffer layer. According to some embodiments, the display layer 100 is illustrated as including a buffer layer BFL.

The buffer layer BFL may improve bonding force between the base layer 110 and the semiconductor pattern. The buffer layer BFL may include a silicon oxide layer and a silicon nitride layer, and the silicon oxide layer and the silicon nitride layer may be alternately laminated.

The semiconductor pattern may be located on the buffer layer BFL. The semiconductor pattern may include poly-silicon. However, the embodiments according to the inventive concept are not limited thereto. For example, the semiconductor pattern may include amorphous silicon or metal oxide.

FIG. 3 illustrates merely a portion of the semiconductor pattern. For example, the semiconductor pattern may be further located on other areas. The semiconductor pattern may be arranged in a specific rule over pixels. The semiconductor pattern has different electrical properties depending on whether the semiconductor pattern is doped. The semiconductor pattern may include a first region having high conductivity and a second region having low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or may be doped at a concentration less than that of the first region.

The first region may have conductivity greater than that of the second region and may substantially serve as an electrode or a signal line. The second region may substantially correspond to an active (or channel) of the transistor. That is to say, a portion of the semiconductor pattern may be an active of the transistor, another portion may be a source or drain of the transistor, and further another portion may be a connection electrode or a connection signal line.

Each of the pixels may have an equivalent circuit including seven transistors, one capacitor, and a light emitting element, and an equivalent circuit diagram of the pixel may be modified in various forms. In FIG. 3, one transistor 100PC and a light emitting device 100PE included in the pixel are illustrated as an example.

A source SC1, an active A1, and a drain D1 of the transistor 100PC may be provided from the semiconductor pattern. The source SC1 and the drain D1 may extend in opposite directions from the active A1 on a cross-section. FIG. 3 illustrates a portion of a connection signal line SCL formed from the semiconductor pattern. According to some embodiments, the connection signal line SCL may be connected to the drain D1 of the transistor 100PC on the plane.

The first insulating layer 10 may be located on the buffer layer BFL. The first insulating layer 10 commonly overlaps the plurality of pixels PX to cover the semiconductor pattern. The first insulating layer 10 may include an inorganic layer and/or an organic layer and have a single-layered or multilayered structure. The first insulating layer 10 may include at least one of oxide, titanium oxide, silicon oxide, silicon oxide nitride, zirconium oxide, or hafnium oxide. According to some embodiments, the first insulating layer 10 may include a single-layered silicon oxide layer. The insulating layer of the circuit layer 120, which will be described later, as well as the first insulating layer 10 may be an inorganic layer and/or an organic layer and may have a single-layered or a multilayered structure. The inorganic layer may include at least one of the above-described materials, but embodiments according to the present disclosure are not limited thereto.

A gate G1 is located on the first insulating layer 10. Each of the gate G1 may be a portion of a metal pattern. The gate G1 overlaps the active A1. In the process in which the semiconductor pattern is doped, the gate G1 may function as a mask.

The second insulating layer 20 may be located on the first insulating layer 10 to cover the gate G1. The second insulating layer 20 may commonly overlap the pixels. The second insulating layer 20 may be an inorganic layer and/or an organic layer and have a single-layered or multilayered structure. According to some embodiments, the first insulating layer 20 may include a single-layered silicon oxide layer.

The third insulating layer 30 may be located on the second insulating layer 20. According to some embodiments, the third insulating layer 30 may be a single-layered silicon oxide layer.

A first connection electrode CNE1 may be located on the third insulating layer 30. The first connection electrode CNE1 may be connected to the signal line SCL through a contact hole CNT-1 passing through the first to third insulating layers 10 to 30.

A fourth insulating layer 40 may be located on the third insulating layer 30. The fourth insulating layer 40 may be a single-layered silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be located on the fifth insulating layer 50 to cover the second connection electrode CNE2. The sixth insulating layer 60 may be an organic layer. A light emitting element layer 130 may be located on the circuit layer 120. The light emitting element layer 130 may include a light emitting element. For example, the light emitting element layer 130 may include an organic light emitting material, quantum dots, quantum rods, a micro LED, or a nano LED. The light emitting element 100PE may include a first electrode AE, an emission layer EL, and a second electrode CE.

The first electrode AE may be located on the sixth insulating layer 60. The first electrode AE may be connected to the second connection electrode CNE2 through a contact hole CNT-3 passing through the sixth insulating layer 60.

A pixel defining layer 70 may be located on the sixth insulating layer 60 to cover a portion of the first electrode AE. An opening 70-OP may be defined in the pixel defining layer 70. The opening 70-OP of the pixel defining layer 70 may expose at least a portion of the first electrode AE. According to some embodiments, an emission area PXA may be defined to correspond to a portion of an area of the first electrode AE, which is exposed by the opening 70-OP. A non-emission area NPXA may surround the emission area PXA.

The emission layer EL may be located on the first electrode AE. The emission layer EL may be located in the opening 70-OP. That is, the emission layer EL may be located to be separated from each of the pixels. When the emission layer EL is arranged to be separated from each of the pixels, each of the emission layers EL may emit light having at least one of blue, red, or green color. However, the embodiments according to the inventive concept are not limited thereto. For example, the emission layer EL may be commonly provided to be connected to the pixels. In this case, the emission layer EL may provide blue light or white light.

The second electrode CE may be located on the emission layer EL. The second electrode CE may have an integrated shape and commonly located on the plurality of pixels. A common voltage may be provided to the second electrode CE, and the second electrode CE may be referred to as a common electrode.

According to some embodiments, a hole control layer may be located between the first electrode AE and the emission layer EL. The hole control layer may be commonly located on the emission area PXA and the non-emission area NPXA. The hole control layer may include a hole transport layer and may further include a hole injection layer. An electron control layer may be located between the emission layer EL and the second electrode CE. The electron control layer may include an electron transport layer and may further include an electron injection layer. The hole control layer and the electron control layer may be commonly formed in the plurality of pixels by using an open mask.

An encapsulation layer 140 may be located on the light emitting element layer 130. The encapsulation layer 140 may include an inorganic layer, an organic layers, and an inorganic layer, which are sequentially laminated, but layers constituting the encapsulation layer 140 are not limited thereto.

The inorganic layers may protect the light emitting element layer 130 against moisture and oxygen, and the organic layer may protect the light emitting element layer 130 against foreign substances such as dust particles. The inorganic layers may include a silicon nitride layer, a silicon oxy nitride layer, a silicon oxide layer, a titanium oxide layer, or an aluminum oxide layer. The organic layer may include an acrylic-based organic layer, but the embodiments according to the inventive concept are not limited thereto.

The sensor layer 200 may be located on the display layer 100 through a continuous process. In this case, the sensor layer 200 may be expressed as being directly arranged on the display layer 100. The direct arrangement may mean that a third component is not located between the sensor layer 200 and the display layer 100. That is, a separate adhesive member may not be located between the sensor layer 200 and the display layer 100. In this case, a thickness of the electronic device 1000 may be thinner.

The sensor layer 200 may include a base insulating layer 201, a first conductive layer 202, a sensing insulating layer 203, a second conductive layer 204, and a cover insulating layer 205.

The base insulating layer 201 may be an inorganic layer including any one of silicon nitride, silicon oxynitride, and silicon oxide. Alternatively, the base insulating layer 201 may be an organic layer including an epoxy resin, an acrylic resin, or an imide-based resin. The base insulating layer 201 may have a single-layered structure or a multilayered structure in which a plurality of layers are laminated in the third direction DR3.

Each of the first conductive layer 202 and the second conductive layer 204 may have a single-layered structure or a multilayered structure in which a plurality of layers are laminated in the third directional axis DR3.

The conductive layer having the single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), and the like. In addition, the transparent conductive layer may include conductive polymers such as PEDOT, metal nanowires, graphene, and the like.

The conductive layer having the multilayered structure may include metal layers. The metal layers may have a three-layered structure of titanium/aluminum/titanium. The conductive layer having the multilayered structure may include at least one metal layer and at least one transparent conductive layer.

At least one of the sensing insulating layer 203 or the cover insulating layer 205 may include an inorganic layer. The inorganic layer may include at least one of aluminum oxide, titanium oxide, silicon oxide, silicon oxynitride, zirconium oxide, or hafnium oxide.

A parasitic capacitance Cb may be generated between the sensor layer 200 and the second electrode CE. As the distance between the sensor layer 200 and the second electrode CE becomes closer, a value of the parasitic capacitance Cb may increase. As the parasitic capacitance Cb increases, a ratio of change in amount of capacitance to the reference value may decrease. The change in capacitance may mean a change in capacitance that occurs before and after an input by the input unit, for example, the input device 2000 (see FIG. 2) or the user's body 3000 (see FIG. 3).

The driving chip processing the signal sensed from the sensor layer 200 may perform a leveling operation of removing a value corresponding to the parasitic capacitance Cb from the sensed signal. The ratio of change in amount of capacitance to the reference value may increase to sensing sensitivity by the leveling operation.

However, there may be a difference in ability to remove a value corresponding to the parasitic capacitance Cb according to a specification of the driving chip. For example, if a maximum parasitic capacitance Cb is about 500 picofarads, and the capacitance value that is capable be being removed from the signal sensed from the sensor layer 200 by the driving chip is about 200 picofarads, a reference value may not be sufficiently lowered by the driving chip. In this case, a ratio of the amount of change in capacitance compared to the reference value is insignificant, and thus, a malfunction in which the driving chip does not recognize the amount of change in capacitance as noise or does not recognize the touch coordinates may occur. According to the inventive concept, the electrode structure of the sensor layer 200 may be modified to provide the maximum value of the parasitic capacitance Cb as a value (e.g., a set or predetermined value) or less. In this case, even when performance of the driving chip is relatively low, accuracy of the coordinate recognition may be improved. The value (e.g., the set or predetermined value) may be about 200 picofarads, but is not particularly limited thereto.

Figure 4:
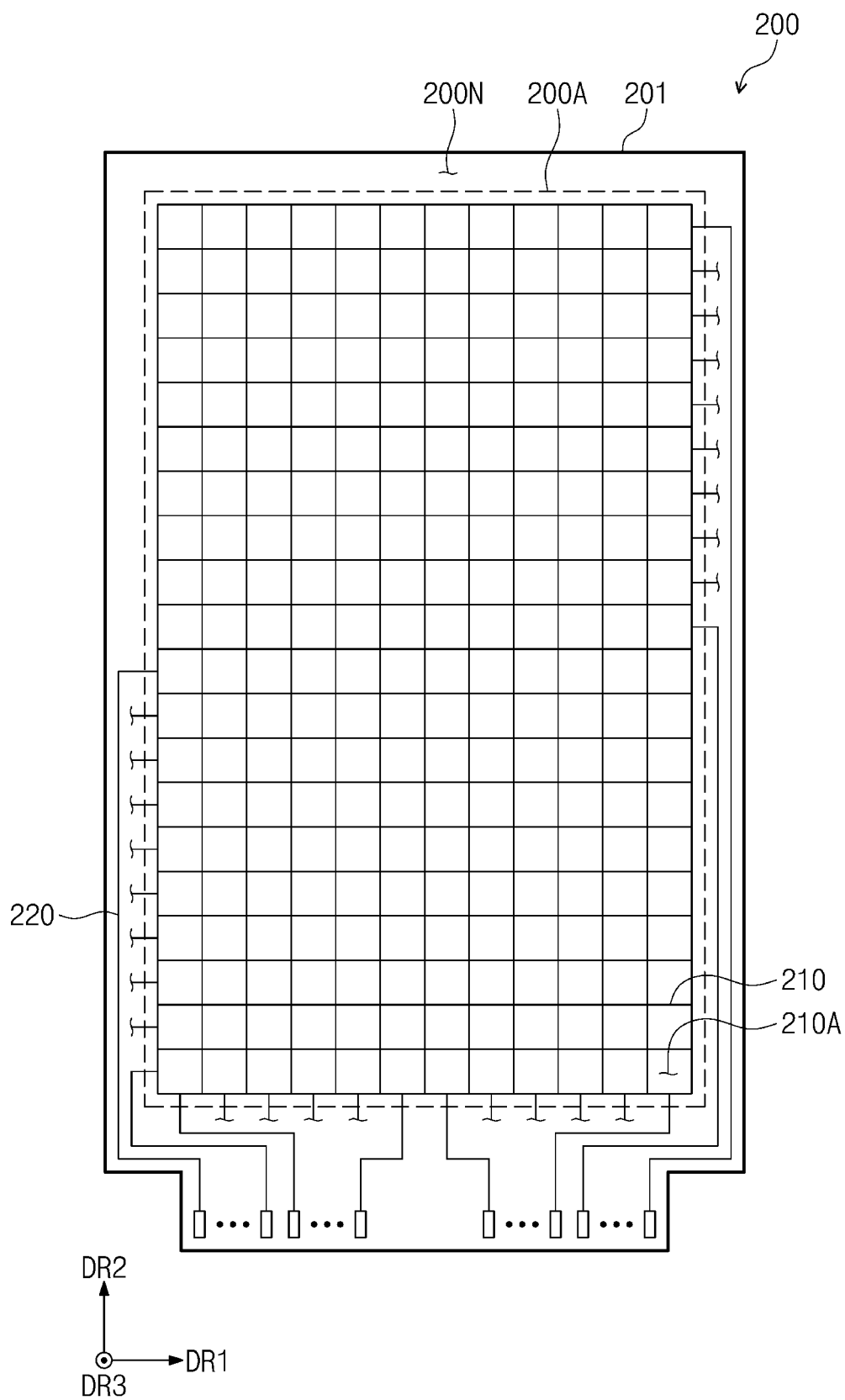
FIG. 4 is a plan view of the sensor layer according to some embodiments of the inventive concept.

FIG. 4 is a plan view of the sensor layer according to some embodiments of the inventive concept.

Referring to FIG. 4, an active area 200A and a peripheral area 200N may be defined on the sensor layer 200. The active area 200A may be an area that is activated according to an electrical signal. For example, the active area 200A may be an area that senses an input. The active area 200A may be referred to as a sensing area 200A. The active area 200A may overlap an active area 1000A of the electronic device 1000.

The peripheral area 200N may be adjacent to the active area 200A. The peripheral area 200N may surround the active area 200A.

The sensor layer 200 may include a base insulating layer 201, a plurality of sensing units 210, and a plurality of lines 220. The plurality of sensing units 210 may be located on the active area 200A. The plurality of lines 220 may be located on the peripheral area 200N.

The sensor layer 200 may operate in a first mode in which information on an external input is acquired through a change in mutual capacitance between the electrodes provided in the plurality of sensing units 210 or a second mode in which an input by the input device 2000 (see FIG. 2) is sensed through a change in capacitance between the electrodes provided in at least one sub sensing units 210A. The first mode and the second mode will be described later.

The plurality of sensing units 210 may be arranged in the first direction DR1 and the second direction DR2. The plurality of lines 220 may be electrically connected to at least one sub sensing unit 210A of each of the plurality of sensing units 210.

Figure 5A:
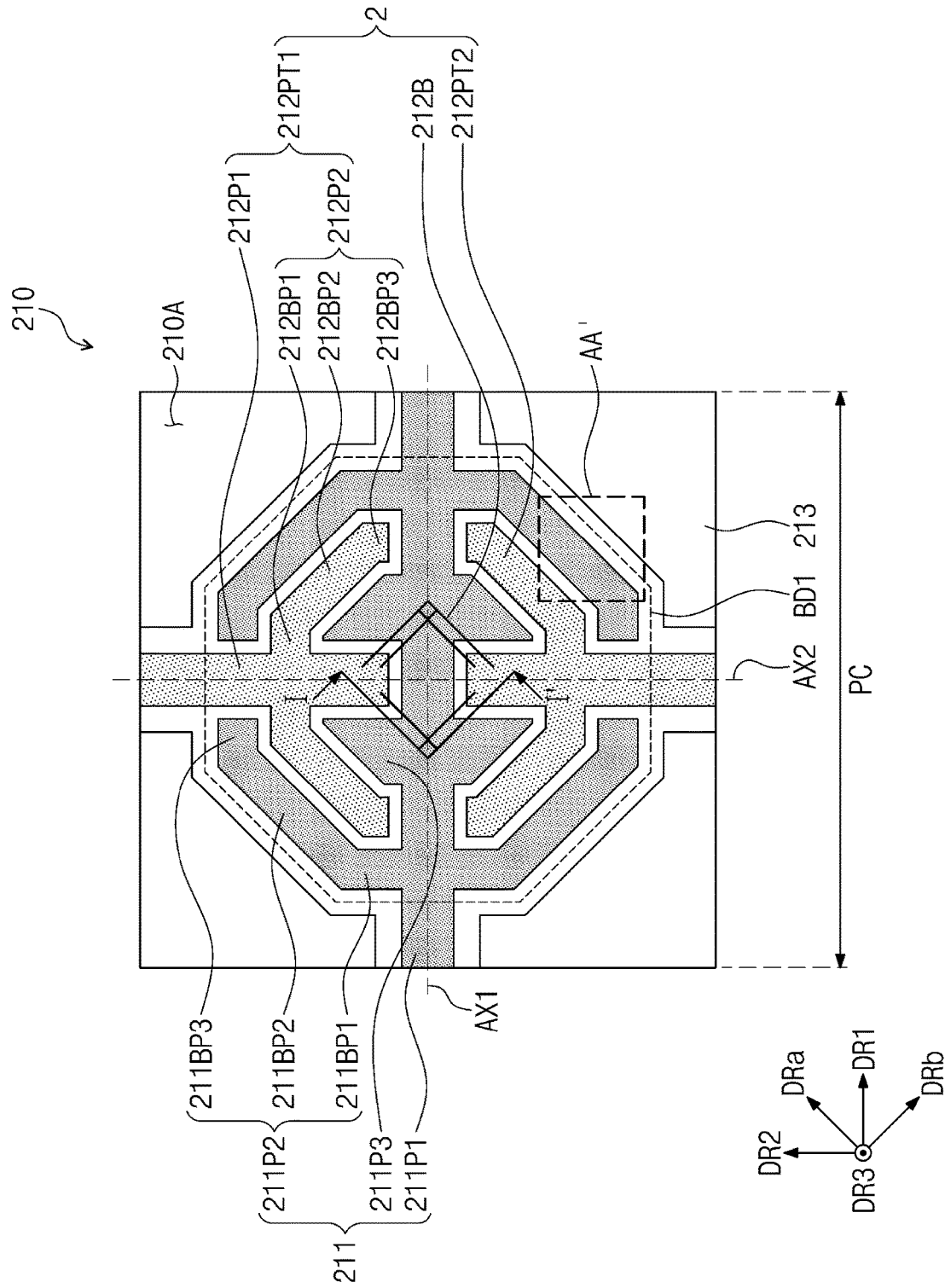
FIG. 5A is a plan view illustrating one of a plurality of sensing units according to some embodiments of the inventive concept.
Figure 5B:
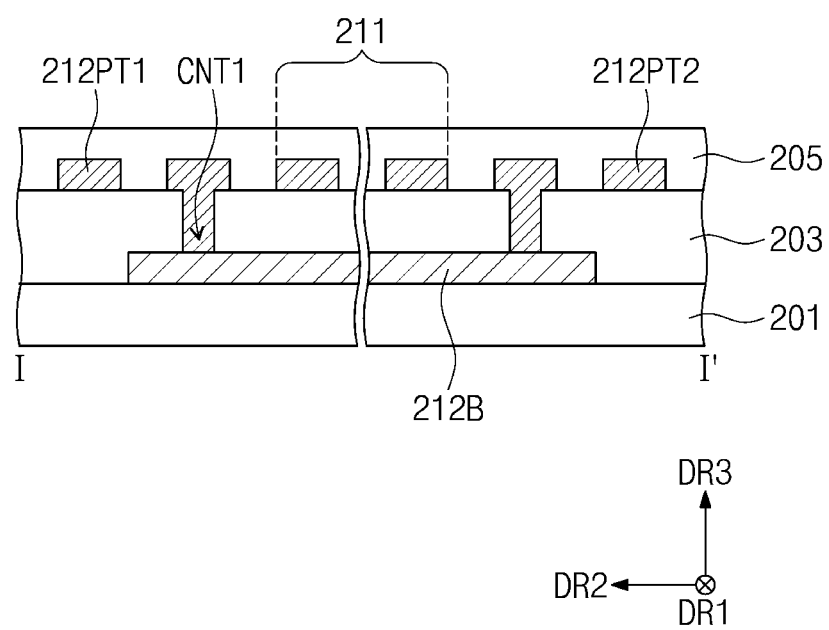
FIG. 5B is a cross-sectional view taken along line I-I' of FIG. 5A according to some embodiments of the inventive concept.
Figure 5C:
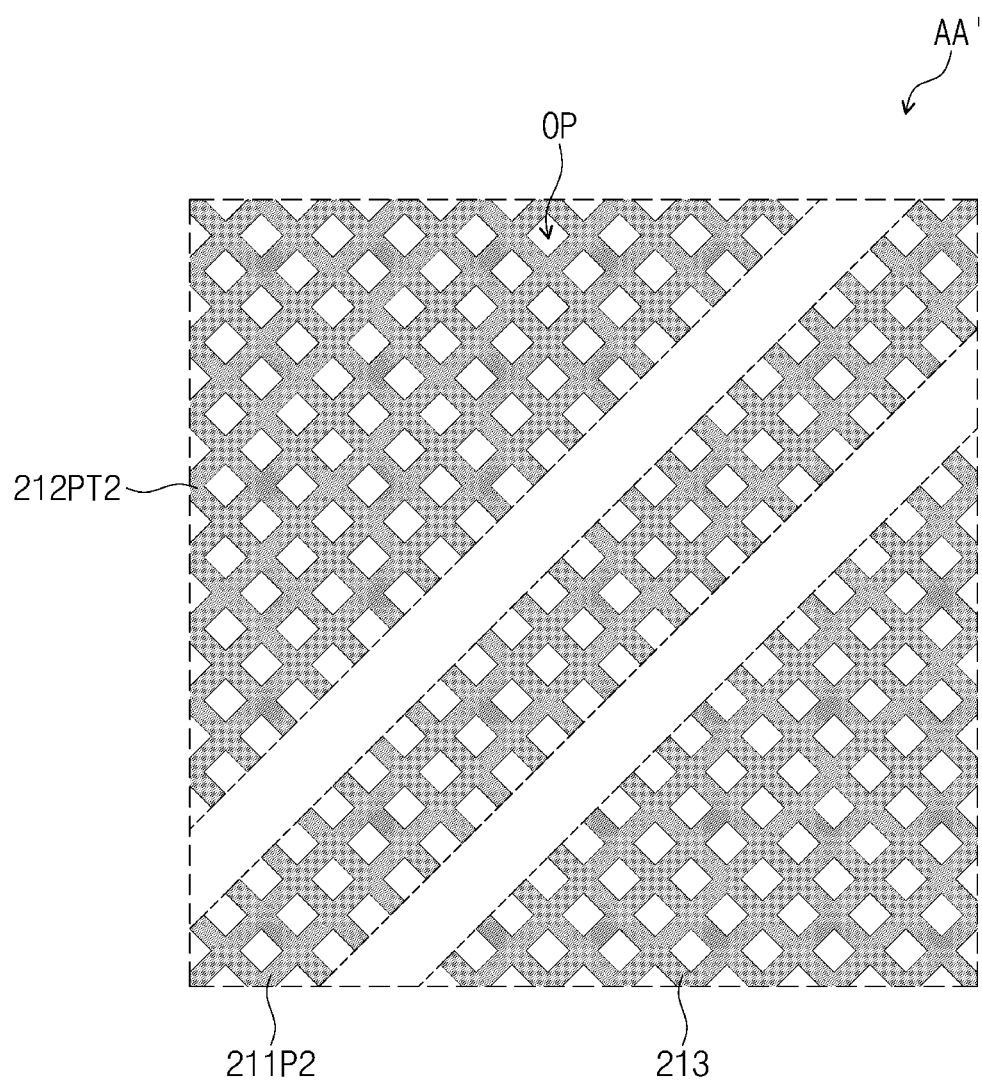
FIG. 5C is an enlarged plan view of an area AA' of FIG. 5A according to some embodiments of the inventive concept.

FIG. 5A is a plan view illustrating one of the plurality of sensing units according to some embodiments of the inventive concept, FIG. 5B is a cross-sectional view taken along line I-I' of FIG. 5A according to some embodiments of the inventive concept, and FIG. 5C is an enlarged plan view of an area AA' of FIG. 5A according to some embodiments of the inventive concept.

Referring to FIGS. 5A to 5C, one sensing unit 210 may include at least one sub sensing unit 210A. FIG. 5A illustrates that one sensing unit 210 includes one sub sensing unit 210A. In this case, one sub sensing unit 210A may mean one sensing unit 210.

The speed sensing unit 210A may have a first pitch PC. The first pitch PC may be about 3.5 mm to about 4.5 mm. For example, the first pitch PC may be about 4 mm.

The sensing unit 210 may include an electrode 211, an cross electrode 212, and a plurality of dummy electrodes 213. A portion of the electrode 211 may be cross with a portion of the cross electrode 212. The sensor layer 200 (see FIG. 4) may acquire information on an external input through a change in mutual capacitance between the electrode 211 and the cross electrode 212.

The electrode 211 may have a shape symmetrical with respect to a first axis AX1 extending in the first direction DR1 and a second axis AX2 extending in the second direction DR2. The electrode 211 may be referred to as a first pattern 211. The electrode 211 may include a first portion 211P1, a plurality of second portions 211P2, and a plurality of third portions 211P3. The first portion 211P1, the plurality of second portions 211P2, and the plurality of third portions 211P3 may be provided to be integrated with each other.

The first portion 211P1 may extend in the first direction DR1.

The plurality of second portions 211P2 may be symmetrical to each other with respect to the first axis AX1 and the second axis AX2. The plurality of second portions 211P2 may protrude from the first portion 211P1. At least one second portion 211P2 of the plurality of second portions 211P2 may extend in a first cross direction DRa crossing the first direction DR1 and the second direction DR2. Another second portion of the plurality of second portions 211P2 may extend in a second cross direction DRb crossing the first cross direction DRa. The first cross direction DRa and the second cross direction DRb may be orthogonal to each other. The second portion 211P2 may surround a second cross portion 212P2. The second portion 211P2 may include a first branch portion 211BP1, a second branch portion 211BP2, and a third branch portion 211BP3. The first branch portion 211BP1, the second branch portion 211BP2, and the third branch portion 211BP3 may be provided to be integrated with each other.

The first branch portion 211BP1 may protrude from the first portion 211P1. One end of the first branch portion 211BP1 may be adjacent to the first portion 211P1, and the other end of the first branch portion 211BP1 may be adjacent to the second branch portion 211BP2. The first branch portion 211BP1 may extend in the second direction DR2.

The second branch portion 211BP2 may protrude from the first branch portion 211BP1. One end of the second branch portion 211BP2 may be adjacent to the first branch portion 211BP1, and the other end of the second branch portion 211BP2 may be adjacent to the third branch portion 211BP3. The second branch portion 211BP2 may extend in the first cross direction DRa or the second cross direction DRb.

The third branch portion 211BP3 may protrude from the second branch portion 211BP2. One end of the third branch portion 211BP3 may be adjacent to the second branch portion 211BP2, and the other end of the third branch portion 211BP3 may be adjacent to the first cross portion 212P1. The third branch portion 211BP3 may extend in the first direction DR1.

The plurality of third portions 211P3 may be symmetrical to each other with respect to the first axis AX1 and the second axis AX2. The plurality of third portions 211P3 may face the plurality of second cross portions 212P2, respectively. The plurality of third portions 211P3 may protrude from the first portion 211P1 in the second direction DR2. The plurality of third portions 211P3 may be spaced apart from the plurality of second portions 211P2, respectively, with the plurality of second cross portions 212P2 therebetween.

The cross electrode 212 may include a first cross pattern 212PT1, a second cross pattern 212PT2, and a bridge pattern 212B.

The first cross pattern 212PT1 may have a shape symmetrical with respect to the second axis AX2. The first cross pattern 212PT1 may include a first cross portion 212P1 and a plurality of second cross portions 212P2. The first cross portion 212P1 and the plurality of second cross portions 212P2 may be provided to be integrated with each other.

The first cross portion 212P1 may extend in the second direction DR2.

The plurality of second cross portions 212P2 may be symmetrical to each other with respect to the second axis AX2. Each of the plurality of second cross portions 212P2 may face the first portion 211P1. The plurality of second cross portions 212P2 may protrude from the first cross portion 212P1. One second cross portion of the plurality of second cross portions 212P2 may extend in the first cross direction DRa. Another second cross portion of the plurality of second cross portions 212P2 may extend in the second cross direction DRb. The plurality of second cross portions 212P2 may be located between the plurality of second portions 211P2 and the plurality of third portions 211P3, respectively. The second cross portion 212P2 may include a first cross branch portion 212BP1, a second cross branch portion 212BP2, and a third cross branch portion 212BP3. The first cross branch portion 212BP1, the second cross branch portion 212BP2, and the third cross branch portion 212BP3 may be provided to be integrated with each other.

The first cross branch portion 212BP1 may protrude from the first cross portion 212P1. One end of the first cross branch portion 212BP1 may be adjacent to the first cross portion 212P1, and the other end of the first cross branch portion 212BP1 may be adjacent to the second cross branch portion 212BP2. The first cross branch portion 212BP1 may extend in the first direction DR1.

The second cross branch portion 212BP2 may protrude from the first cross branch portion 212BP1. One end of the second cross branch portion 212BP2 may be adjacent to the first cross branch portion 212BP1, and the other end of the second cross branch portion 212BP2 may be adjacent to the third cross branch portion 212BP3. The two cross branch portions 212BP2 may extend in the first cross direction DRa or the second cross direction DRb.

The third cross branch portion 212BP3 may protrude from the second cross branch portion 212BP2. One end of the third cross branch portion 212BP3 may be adjacent to the second cross branch portion 212BP2, and the other end of the third cross branch portion 212BP3 may be adjacent to the first portion 211P1. The third cross branch portion 212BP3 may extend in the second direction DR2.

The second cross pattern 212PT2 may be spaced apart from the first cross pattern 212PT1 with the first portion 211P1 therebetween. The first cross pattern 212PT1 and the second cross pattern 212PT2 may be symmetrical to each other with respect to the first axis AX1.

The bridge pattern 212B may electrically connect the first cross pattern 212PT1 to the second cross pattern 212PT2. The bridge pattern 212B may be cross to be insulated from the first portion 211P1.

The bridge pattern 212B may be located on the base insulating layer 201. The sensing insulating layer 203 may be located on the bridge pattern 212B. The sensing insulating layer 203 may cover the bridge pattern 212B. The sensing insulating layer 203 may include an inorganic material, an organic material, or a composite material.

The first cross pattern 212PT1, the second cross pattern 212PT2, and the electrode 211 may be located on the sensing insulating layer 203.

A plurality of first contact holes CNT1 may be defined to pass through the sensing insulating layer 203 in the third direction DR3. Each of the first cross pattern 212PT1 and the second cross pattern 212PT2 may be electrically connected to the bridge pattern 212B through each of the plurality of first contact holes CNT1.

The cover insulating layer 205 may be located on the first cross pattern 212PT1, the second cross pattern 212PT2, and the electrode 211. The cover insulating layer 205 may cover the first cross pattern 212PT1, the second cross pattern 212PT2, and the electrode 211. The cover insulating layer 205 may include an inorganic material, an organic material, or a composite material.

In FIG. 5B, the bridge pattern 212B may have a bottom bridge structure in which the bridge pattern 212B is located under the first cross pattern 212PT1, the second cross pattern 212PT2, and the electrode 211, but the structure of the sensor layer 200 (see FIG. 4) according to some embodiments of the inventive concept is not limited thereto. For example, the sensor layer 200 (see FIG. 4) according to some embodiments of the inventive concept may have a top bridge structure in which the bridge pattern 212B is located on the first cross pattern 212PT1, the second cross pattern 212PT2, and the electrode 211.

The electrode 211, the cross electrode 212, and the plurality of dummy electrodes 213 may have a mesh structure. In FIG. 5C, a portion of the second cross pattern 212PT2, a portion of the electrode 211, and a portion of the plurality of dummy electrodes 213 are illustrated in FIG. 5C as an example. An opening OP defined by the mesh structure may overlap the emission area PXA (see FIG. 3).

According to the inventive concept, the plurality of second portions 211P2, the plurality of second cross portions 212P2, and the plurality of third portions 211P3 may be located adjacent to each other. The plurality of second portions 211P2, the plurality of second cross portions 212P2, and the plurality of third portions 211P3 may have a shape interdigitated with each other. A boundary on which each of the plurality of second portions 211P2, each of the plurality of second cross portions 212P2, and each of the plurality of third portions 211P3 face each other may increase in length. Thus, mutual capacitance between the electrode 211 and the cross electrode 212 may increase. Also, an amount of change in mutual capacitance before and after the input of the user's body 3000 (see FIG. 2) may increase. Thus, the sensing sensitivity of the sensor layer 200 (see FIG. 4) may be improved.

When viewed on a plane, the outermost portion of an electrode area BD1, which is defined by the plurality of second portions 211P2, the plurality of second cross portions 212P2, and the plurality of third portions 211P3 may have an octagonal shape. For example, the outermost portion of an area defined by the plurality of second portions 211P2, which respectively surround the plurality of second cross portions 212P2 and the plurality of third portions 211P3, may have an octagonal shape.

When an area on which the electrode 211 and the cross electrode 212 are cross to be insulated from each other has a rectangular shape by portions respectively extending in the first direction DR1 and the second direction DR2, an interval between the electrode 211 and the cross electrode 212 may increase on an area on which the directions of the extending portions are changed from the first direction DR1 to the second direction DR2, and thus, a deviation of the interval between the electrode 211 and the cross electrode 212 may increase. However, according to the inventive concept, the electrode area BD1 on which the electrode 211 and the cross electrode 212 are cross to be insulated from each other may have an octagonal shape by portions respectively extending in the first direction DR1, the second direction DR2, the first cross direction DRa, and the second cross direction DRb. The deviation of the interval between the electrode 211 and the cross electrode 212 may be reduced. Therefore, a deviation in amount of change in the mutual capacitance between the electrode 211 and the cross electrode 212 before and after the input of the user's body 3000 (see FIG. 2) according to the position of the user's body 3000 (see FIG. 2) may be reduced. Thus, accuracy of coordinates of the input of the user's body 3000 (see FIG. 2), which are calculated using the sensor layer 200 (see FIG. 4), may be improved. Also, sensing reliability of the sensor layer 200 (see FIG. 4) may be improved.

Also, according to the inventive concept, a deviation of the interval between the electrode 211 and the cross electrode 212 may be reduced. A deviation in amount of change in the mutual capacitance between each of the electrode 211 and the cross electrode 212 and the input device 2000 (see FIG. 2) before and after the sensing of the input device 2000 (see FIG. 2) according to the position of the input device 2000 (see FIG. 2) may be reduced. Thus, the accuracy of the sensing coordinates of the input device 2000 (see FIG. 2), which are calculated using the sensor layer 200 (see FIG. 4), may be improved. Also, the sensing reliability of the sensor layer 200 (see FIG. 4) may be improved.

That is, amounts of change in capacitance, which are measured within one sensing unit 210 in the input provided in the form of a line, such as when writing a letter or drawing a picture using the input device 2000 (see FIG. 2) may be prevented from being different from each other, and thus, lineartity of the input may be improved, and the sensing reliability of the sensor layer 200 (see FIG. 4) may be improved.

The plurality of dummy electrodes 213 may surround the electrode 211 and the cross electrode 212, respectively. As the plurality of dummy electrodes 213 are arranged, a difference in transmittance or reflectance between portions, on which the electrode 211 or the cross electrode 212 is not located, may be reduced. As a result, a phenomenon in which a specific boundary, for example, a boundary between the electrode 211 and the cross electrode 212 or a boundary between the portions on which the electrode 211 and the cross electrode 212 are not located, is visually recognized may be prevented.

The plurality of dummy electrodes 213 may be in a floating state. The plurality of dummy electrodes 213 are floated to reduce parasitic capacitance Cb (see FIG. 3) generated between the sensor layer 200 (see FIG. 3) and the second electrode CE (see FIG. 3). According to some embodiments of the inventive concept, the sensor layer 200 (see FIG. 3) may provide the maximum value of the parasitic capacitance Cb (see FIG. 3) as the value (e.g., the set or predetermined value) or less. The ratio of the amount of change in capacitance to the reference value may increase. Thus, the sensing sensitivity of the sensor layer 200 (see FIG. 3) with respect to the amount of change in capacitance may be improved.

Figure 6:
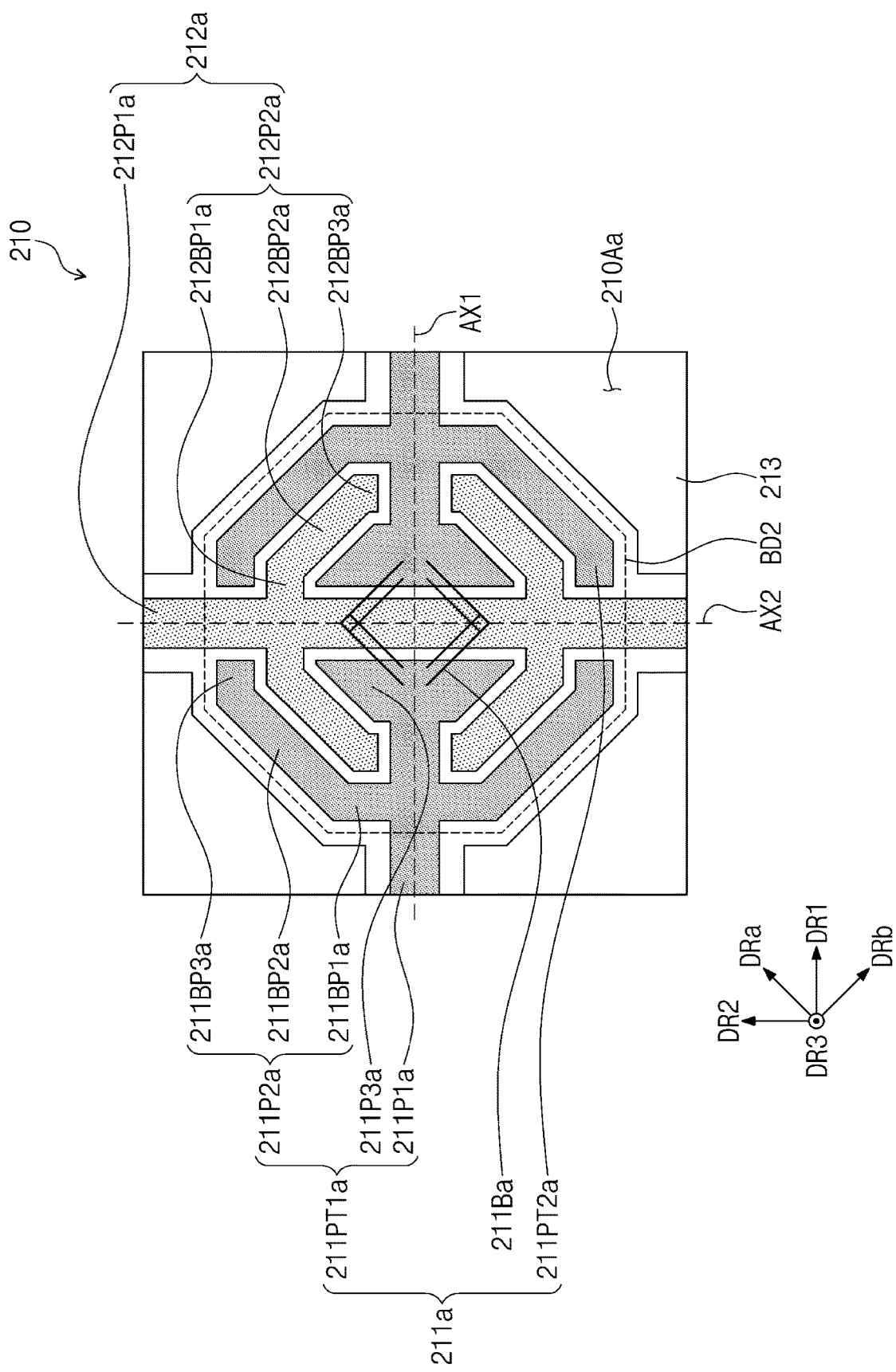
FIGS. 6 to 8 are plan views illustrating one of a plurality of sensing units according to some embodiments of the inventive concept.
Figure 7:
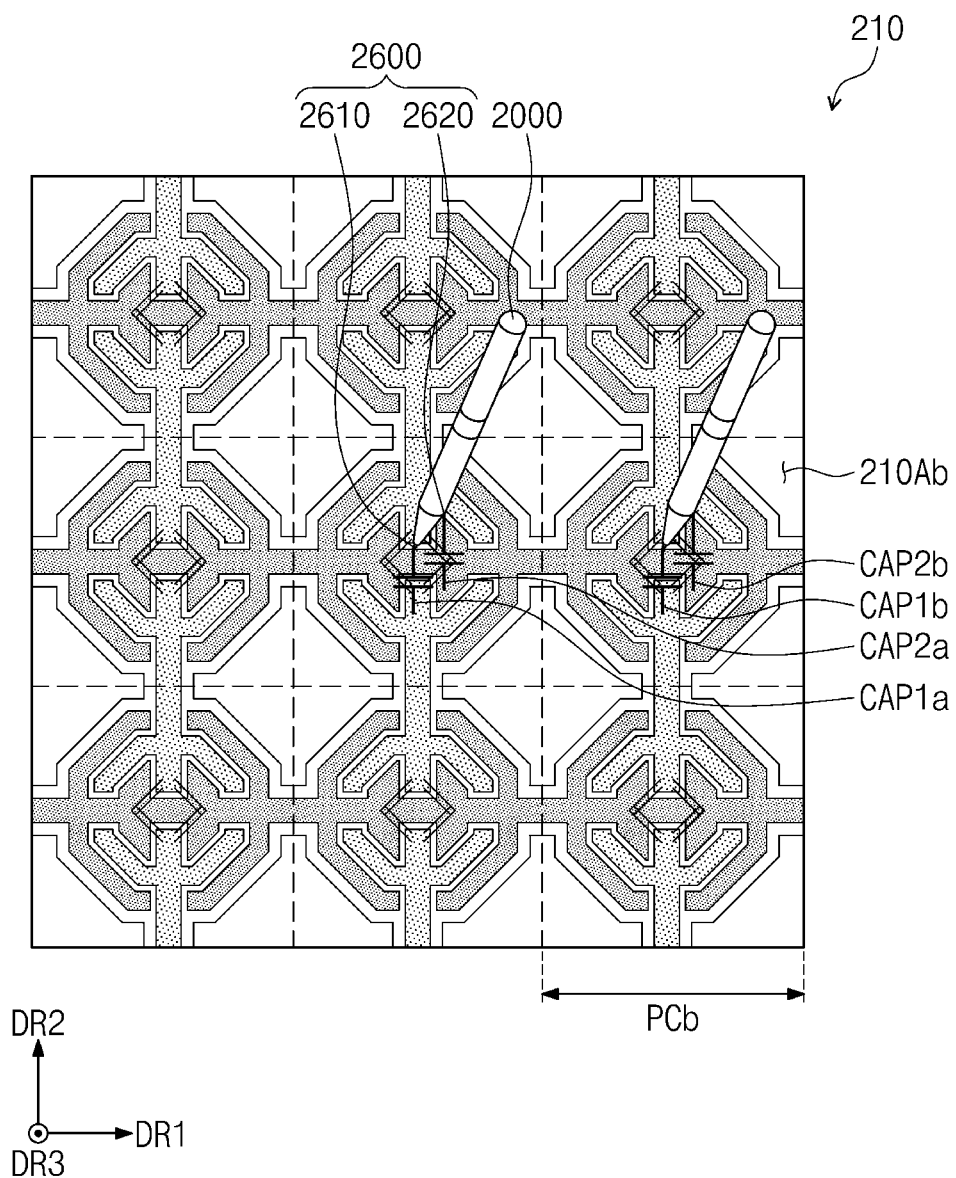
Figure 8:
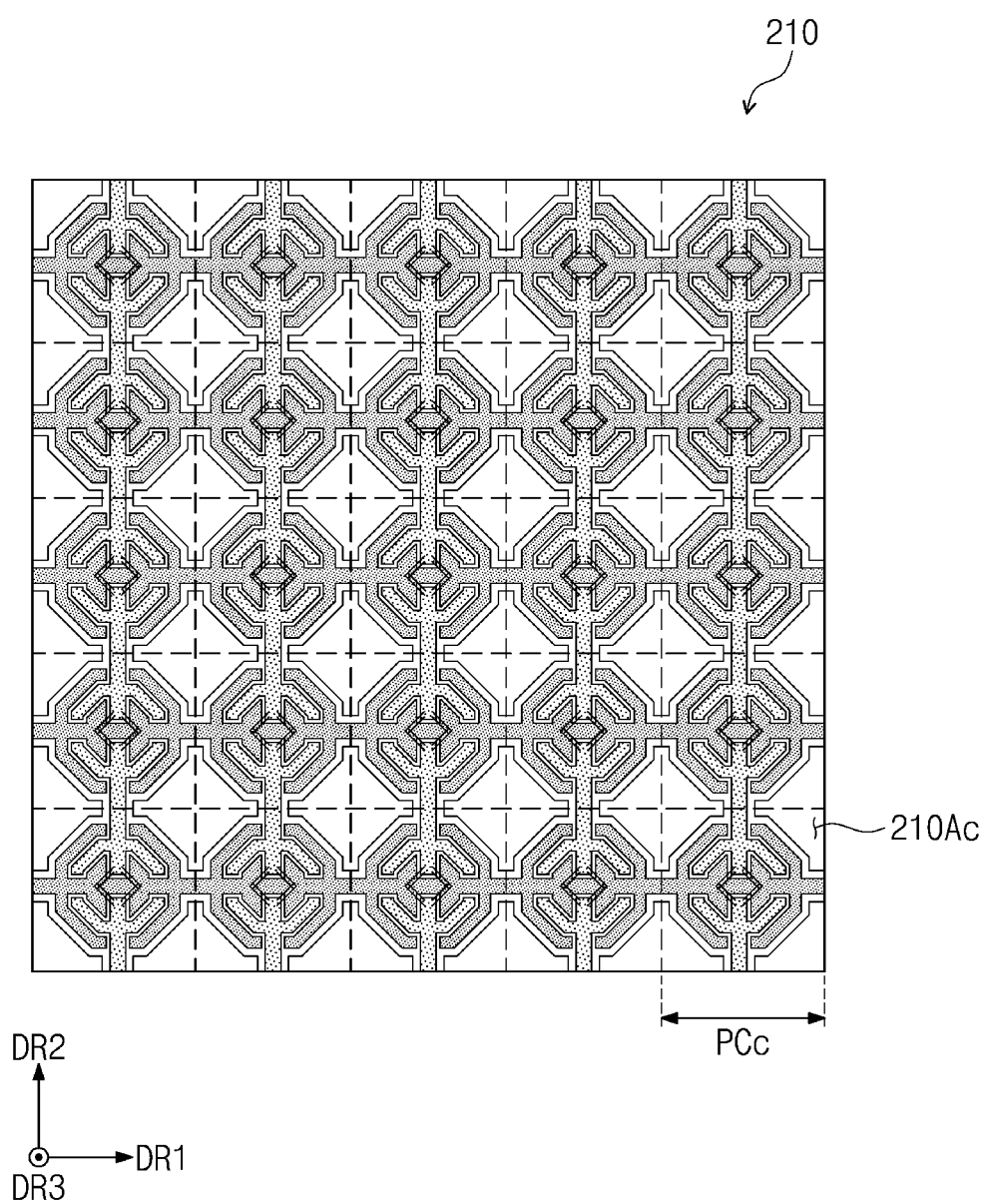

FIGS. 6 to 8 are plan views illustrating one of the plurality of sensing units according to some embodiments of the inventive concept.

Referring to FIG. 6, one sensing unit 210a may include one sub sensing unit 210Aa. However, this is merely an example. For example, the number of sub sensing units 210Aa provided in one sensing unit 210a according to some embodiments of the inventive concept is not limited thereto. For example, one sensing unit 210a may include a plurality of sub sensing units 210Aa.

According to some embodiments of the inventive concept, the electrode may be referred to as an cross electrode, and similarly, the cross electrode may be referred to as an electrode.

The electrode 211a may include a first electrode pattern 211PT1a, a second electrode pattern 211PT2a, and a bridge pattern 211Ba.

The first electrode pattern 211PT1a may have a shape symmetrical with respect to the first axis AX1. The first electrode pattern 211PT1a may include a first portion 211P1a, a plurality of second portions 211P2a, and a plurality of third portions 211P3a. The first portion 211Pa, the plurality of second portions 211P2a, and the plurality of third portions 211P3a may be provided to be integrated with each other.

The first portion 211P1a may extend in the first direction DR1.

The plurality of second portions 211P2a may be symmetrical to each other with respect to the first axis AX1. Each of the plurality of second portions 211P2a may face the first cross portion 212P1a. The plurality of second portions 211P2a may protrude from the first portion 211P1a. One second portion of the plurality of second portions 211P2a may extend in the first cross direction DRa. Another second portion of the plurality of second portions 211P2a may extend in the second cross direction DRb. The second portion 211P2a may surround the second cross portion 212P2a. The second portion 211P2a may include a first branch portion 211BP1a, a second branch portion 211BP2a, and a third branch portion 211BP3a. The first branch portion 211BP1a, the second branch portion 211BP2a, and the third branch portion 211BP3a may be provided to be integrated with each other.

The first branch portion 211BP1a may protrude from the first portion 211P1a. One end of the first branch portion 211BP1a may be adjacent to the first portion 211P1a, and the other end of the first branch portion 211BP1*a* may be adjacent to the second branch portion 211BP2*a*. The first branch portion 211BP1*a* may extend in the second direction DR2.

The second branch portion 211BP2*a* may protrude from the first branch portion 211BP1*a*. One end of the second branch portion 211BP2*a* may be adjacent to the first branch portion 211BP1*a*, and the other end of the second branch portion 211BP2*a* may be adjacent to the third branch portion 211BP3*a*. The second branch portion 211BP2*a* may extend in the first cross direction DRa or the second cross direction DRb.

The third branch portion 211BP3*a* may protrude from the second branch portion 211BP2*a*. One end of the third branch portion 211BP3*a* may be adjacent to the second branch portion 211BP2*a*, and the other end of the third branch portion 211BP3*a* may be adjacent to the first cross portion 212P1*a*. The third branch portion 211BP3*a* may extend in the first direction DR1.

The plurality of third portions 211P3*a* may be symmetrical with respect to the first axis AX1. The plurality of third portions 211P3*a* may face the plurality of second cross portions 212P2*a*, respectively. The plurality of third portions 211P3*a* may protrude from the first portion 211P1*a* in the second direction DR2. The plurality of third portions 211P3*a* may be spaced apart from the plurality of second portions 211P2*a*, respectively, with the plurality of second cross portions 212P2*a* therebetween.

The second electrode pattern 211PT2*a* may be spaced apart from the first electrode pattern 211PT1*a* with the first cross portion 212P1*a* therebetween. The first electrode pattern 211PT1*a* and the second electrode pattern 211PT2*a* may be symmetrical to each other with respect to the second axis AX2.

The bridge pattern 211Ba may electrically connect the first electrode pattern 211PT1*a* to the second electrode pattern 211PT2*a*. The bridge pattern 211Ba may be span across the second axis AX2 and the first cross portion 212P1*a* while remaining insulated from the first cross portion 212P1*a*.

The cross electrode 212*a* may have a shape symmetrical with respect to the first axis AX1 and the second axis AX2. The cross electrode 212*a* may include a first cross portion 212P1*a* and a plurality of second cross portions 212P2*a*. The first cross portion 212P1*a* and the plurality of second cross portions 212P2*a* may be provided to be integrated with each other.

The first cross portion 212P1*a* may extend in the second direction DR2.

The plurality of second cross portions 212P2*a* may be symmetrical to each other with respect to the first axis AX1 and the second axis AX2. The plurality of second cross portions 212P2*a* may protrude from the first cross portion 212P1*a*. At least one second cross portion of the plurality of second cross portions 212P2*a* may extend in the first cross direction DRa. Another second cross portion of the plurality of second cross portions 212P2*a* may extend in the second cross direction DRb. The second cross portion 212P2*a* may be located between the second portion 211P2*a* and the third portion 211P3*a*. Each of the plurality of second cross portions 212P2*a* may include a first cross branch portion 212BP1*a*, a second cross branch portion 212BP2*a*, and a third cross branch portion 212BP3*a*. The first cross branch portion 212BP1*a*, the second cross branch portion 212BP2*a*, and the third cross branch portion 212BP3*a* may be provided to be integrated with each other.

The first cross branch portion 212BP1*a* may protrude from the first cross portion 212P1*a*. One end of the first cross branch portion 212BP1*a* may be adjacent to the first cross portion 212P1*a*, and the other end of the first cross branch portion 212BP1*a* may be adjacent to the second cross branch portion 212BP2*a*. The first cross branch portion 212BP1*a* may extend in the first direction DR1.

The second cross branch portion 212BP2*a* may protrude from the first cross branch portion 212BP1*a*. One end of the second cross branch portion 212BP2*a* may be adjacent to the first cross branch portion 212BP1*a*, and the other end of the second cross branch portion 212BP2*a* may be adjacent to the third cross branch portion 212BP3*a*. The second cross branch portion 212BP2*a* may extend in the first cross direction DRa or the second cross direction DRb.

The third cross branch portion 212BP3*a* may protrude from the second cross branch portion 212BP2*a*. One end of the third cross branch portion 212BP3*a* may be adjacent to the second cross branch portion 212BP2*a*, and the other end of the third cross branch portion 212BP3*a* may be adjacent to the first portion 211P1*a*. The third cross branch portion 212BP3*a* may extend in the second direction DR2.

The electrode 211*a*, the cross electrode 212*a*, and the plurality of dummy electrodes 213 may have a mesh structure.

According to some embodiments of the inventive concept, the plurality of second portions 211P2*a*, the plurality of second cross portions 212P2*a*, and the plurality of third portions 211P3*a* may be located adjacent to each other. The plurality of second portions 211P2*a*, the plurality of second cross portions 212P2*a*, and the plurality of third portions 211P3*a* may have a shape interdigitated with each other. A boundary between each of the plurality of second portions 211P2*a*, each of the plurality of second cross portions 212P2*a*, and each of the plurality of third portions 211P3*a* may increase in length. Thus, the mutual capacitance between the electrode 211*a* and the cross electrode 212*a* may increase. Also, an amount of change in mutual capacitance before and after the input of the user's body 3000 (see FIG. 2) may increase. Thus, the sensing sensitivity of the sensor layer 200 (see FIG. 4) may be improved.

When viewed on the plane, the outermost portion of the electrode area BD2, which is defined by the plurality of second portions 211P2*a*, the plurality of second cross portions 212P2*a*, and the plurality of third portions 211P3*a*, may have an octagonal shape.

FIGS. 7 to 8 are plan views illustrating one of the plurality of sensing units according to some embodiments of the inventive concept. In description of FIG. 7, the same reference numerals are used for the components described in FIG. 5A, and descriptions thereof are omitted.

Referring to FIG. 7, one sensing unit 210 may include a plurality of sub sensing units 210Ab. The plurality of sub sensing units 210Ab may be arranged in the first direction DR1 and the second direction DR2. For example, nine sub sensing units 210Ab may be provided.

Each of the plurality of sub sensing units 210Ab may have the same shape as the sub sensing unit 210A (see FIG. 5A) of FIG. 5A.

Each of the plurality of sub sensing units 210Ab may have a second pitch PCb. The second pitch PCb of the plurality of sub sensing units 210Ab may be less than the first width WE (see FIG. 2) of the input area of the pen electrode 2600 of the input device 2000. The second pitch PCb may be about 1.0 mm to about 2.0 mm. For example, the second pitch PCb may be about 1.5 mm. A surface area of the input area of the input device 2000 may be less than that of each of the plurality of sub sensing units 210Ab.

The pen electrode 2600 may include a first pen electrode 2610 and a second pen electrode 2620. The first pen electrode 2610 may be located at one end of the input device 2000. The second pen electrode 2620 may be located on a side surface of the input device 2000. The sensor layer 200 (see FIG. 4) may acquire coordinates of the input device 2000 through the first pen electrode 2610 and acquire an inclination of the input device 2000 through the second pen electrode 2620.

According to some embodiments of the inventive concept, when the input device 2000 is sensed, the input area of the input device 2000 overlapping the sensor layer 200 (see FIG. 4) may cover an area of the sub sensing unit 210Ab. A difference between first capacitance CAP1*a* sensed by the first pen electrode 2610 when the input device 2000 is located at a first position within one sensing unit 210 and second capacitance CAP1*b* sensed by the first pen electrode 2610 when the input device 2000 is located at a second position within one sensing unit 210 may be reduced. That is, a deviation in capacitance between the input device 2000 and the sensor layer 200 (see FIG. 4) according to the positions of the input device 2000 within one sensing unit 210 may be reduced. Thus, coordinate accuracy and sensing reliability of the sensor layer 200 (see FIG. 4) for the input device 2000 may be improved.

Also, according to some embodiments of the inventive concept, a difference between first capacitance CAP2*a* sensed by the second pen electrode 2620 when the input device 2000 is located at the first position within one sensing unit 210 and second capacitance CAP2*b* sensed by the second pen electrode 2620 when the input device 2000 is located at the second position within one sensing unit 210 may be reduced. That is, a deviation in capacitance between the input device 2000 and the sensor layer 200 (see FIG. 4) according to the positions of the input device 2000 within one sensing unit 210 may be reduced. Thus, inclination accuracy and sensing reliability of the sensor layer 200 (see FIG. 4) for the input device 2000 may be improved.

FIGS. 8 to 8 are plan views illustrating one of the plurality of sensing units according to some embodiments of the inventive concept. In description of FIG. 8, the same reference numerals are used for the components described in FIG. 5A, and descriptions thereof are omitted.

Referring to FIG. 8, one sensing unit 210 may include a plurality of sub sensing units 210Ac. The plurality of sub sensing units 210Ac may be arranged in the first direction DR1 and the second direction DR2. For example, 25 sub sensing units 210Ac may be provided. However, this is merely an example. For example, the number of the plurality of sub sensing units 210Ac according to some embodiments of the inventive concept is not limited thereto. For example, the number of the plurality of sub sensing units 210Ac may be provided as 16 or 4 units.

Each of the plurality of sub sensing units 210Ac may have the same shape as the sub sensing unit 210A (see FIG. 5A) of FIG. 5A. Each of the plurality of sub sensing units 210Ac may have a third pitch PCc. The third pitch PCc of the plurality of sub sensing units 210Ac may be less than the first width WD (see FIG. 2) of the input area of the pen electrode 2600 (see FIG. 2) of the input device 2000 (see FIG. 2). The third pitch PCc may be less than the second pitch PCb (see FIG. 7).

According to some embodiments of the inventive concept, the surface area of the input area of the input device 2000 (see FIG. 2) may be less than that of each of the plurality of sub sensing units 210Ac. Thus, the sensor layer 200 (see FIG. 4) may accurately sense the coordinates inputted by the input device 2000 (see FIG. 2).

Figure 9:
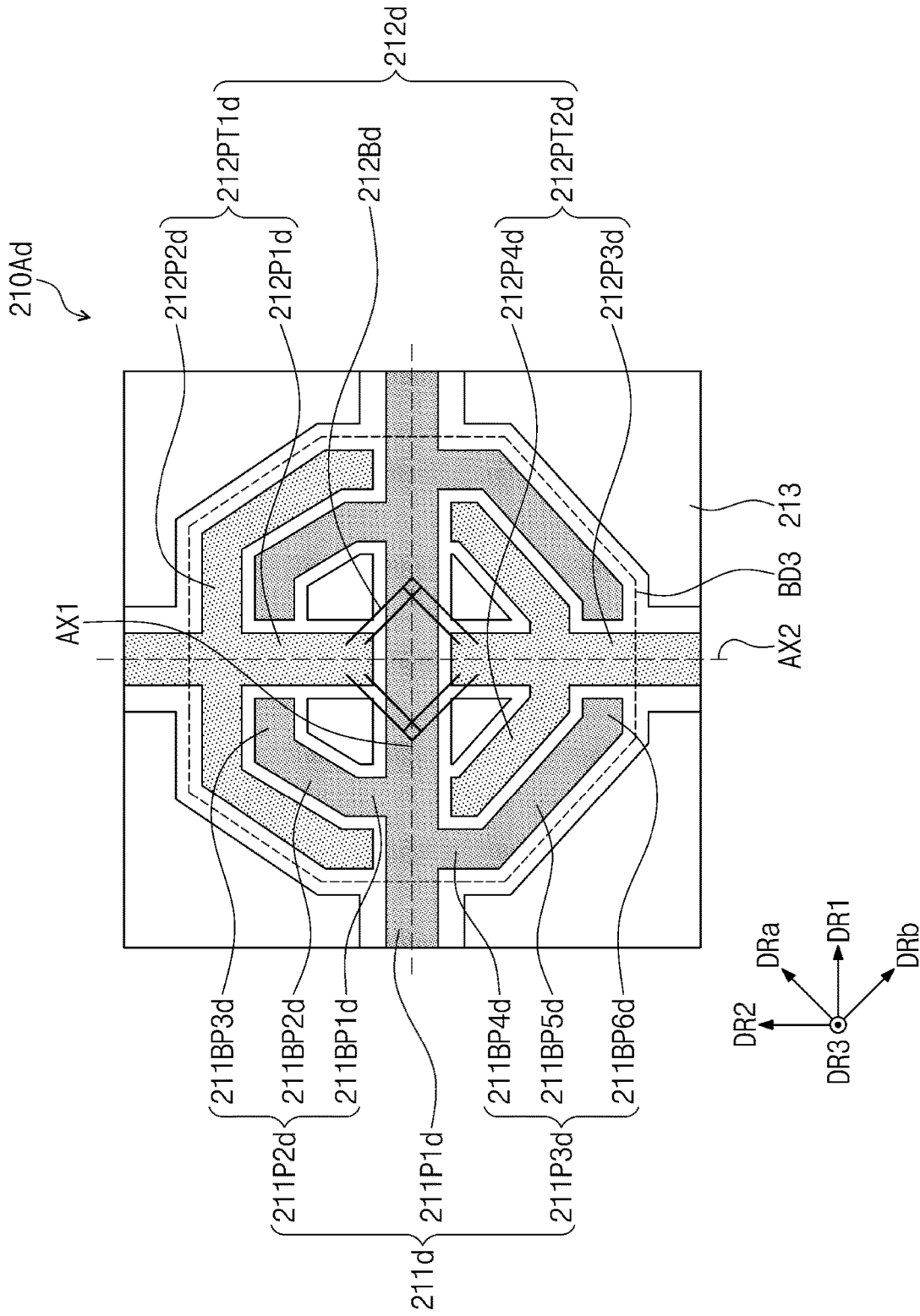
FIGS. 9 to 13 are plan views illustrating a sub sensing unit according to some embodiments of the inventive concept.

FIG. 9 is a plan view of the sub sensing unit according to some embodiments of the inventive concept. In description in FIG. 9, the same reference numerals are used for components described in FIG. 5A, and descriptions thereof are omitted.

Referring to FIGS. 4 and 9, the plurality of sensing units 210 may include at least one sub sensing unit 210Ad. The at least one sub sensing unit 210Ad may include an electrode 211*d*, an cross electrode 212*d*, and a plurality of dummy electrodes 213. A portion of the electrode 211*d* may be cross with a portion of the cross electrode 212*d*. The sensor layer 200 may acquire information on an external input through a change in mutual capacitance between the electrode 211*d* and the cross electrode 212*d*.

The electrode 211*d* may have a shape symmetrical with respect to the second axis AX2. The electrode 211*d* may include a first portion 211P1*d*, a plurality of second portions 211P2*d*, and a plurality of third portions 211P3*d*. The first portion 211P1*d*, the plurality of second portions 211P2*d*, and the plurality of third portions 211P3*d* may be provided to be integrated with each other.

The first portion 211P1*d* may extend in the first direction DR1.

The plurality of second portions 211P2*d* may be symmetrical to each other with respect to the second axis AX2. The plurality of second portions 211P2*d* may be adjacent to the plurality of second cross portions 212P2*d*. The plurality of second portions 211P2*d* may protrude from the first portion 211P1*d*. Each of the plurality of second portions 211P2*d* may include a first branch portion 211BP1*d*, a second branch portion 211BP2*d*, and a third branch portion 211BP3*d*. The first branch portion 211BP1*d*, the second branch portion 211BP2*d*, and the third branch portion 211BP3*d* may be provided to be integrated with each other.

The first branch portion 211BP1*d* may protrude from the first portion 211P1*d*. One end of the first branch portion 211BP1*d* may be adjacent to the first portion 211P1*d*, and the other end of the first branch portion 211BP1*d* may be adjacent to the second branch portion 211BP2*d*. The first branch portion 211BP1*d* may extend in the second direction DR2.

The second branch portion 211BP2*d* may protrude from the first branch portion 211BP1*d*. One end of the second branch portion 211BP2*d* may be adjacent to the first branch portion 211BP1*d*, and the other end of the second branch portion 211BP2*d* may be adjacent to the third branch portion 211BP3*d*. The second branch portion 211BP2*d* may extend in the first cross direction DRa or the second cross direction DRb.

The third branch portion 211BP3*d* may protrude from the second branch portion 211BP2*d*. One end of the third branch portion 211BP3*d* may be adjacent to the second branch portion 211BP2*d*, and the other end of the third branch portion 211BP3*d* may be adjacent to the first cross portion 212P1*d*. The third branch portion 211BP3*d* may extend in the first direction DR1.

The plurality of third portions 211P3*d* may be spaced apart from the plurality of second portions 211P2*d*, respectively, with the first portion 211P1*d* therebetween. The plurality of third portions 211P3*d* may respectively surround the plurality of fourth cross portions 212P4*d*. The plurality of third portions 211P3*d* may be symmetrical to each other with respect to the second axis AX2. The plurality of third portions 211P3*d* may be adjacent to the plurality of fourth cross portions 212P4d. The plurality of third portions 211P3d may protrude from the first portion 211P1d. Each of the plurality of third portions 211P3d may include a fourth branch portion 211BP4d, a fifth branch portion 211BP5d, and a sixth branch portion 211BP6d. The fourth branch portion 211BP4d, the fifth branch portion 211BP5d, and the sixth branch portion 211BP6d may be provided to be integrated with each other.

The fourth branch portion 211BP4d may protrude from the first portion 211P1d. One end of the fourth branch portion 211BP4d may be adjacent to the first portion 211P1d, and the other end of the fourth branch portion 211BP4d may be adjacent to the fifth branch portion 211BP5d. The fourth branch portion 211BP4d may extend in the second direction DR2.

The fifth branch portion 211BP5d may protrude from the fourth branch portion 211BP4d. One end of the fifth branch portion 211BP5d may be adjacent to the fourth branch portion 211BP4d, and the other end of the fifth branch portion 211BP5d may be adjacent to the sixth branch portion 211BP6d. The fifth branch portion 211BP5d may extend in the first cross direction DRa or the second cross direction DRb.

The sixth branch portion 211BP6d may protrude from the fifth branch portion 211BP5d. One end of the sixth branch portion 211BP6d may be adjacent to the fifth branch portion 211BP5d, and the other end of the sixth branch portion 211BP6d may be adjacent to the third cross portion 212P3d. The sixth branch portion 211BP6d may extend in the first direction DR1.

The cross electrode 212d may include a first cross pattern 212PT1d, a second cross pattern 212PT2d, and a bridge pattern 212Bd.

The first cross pattern 212PT1d may have a shape symmetrical with respect to the second axis AX2. The first cross pattern 212PT1d may include a first cross portion 212P1d and a plurality of second cross portions 212P2d. The first cross portion 212P1d and the plurality of second cross portions 212P2d may be provided to be integrated with each other.

The first cross portion 212P1d may extend in the second direction DR2.

The plurality of second cross portions 212P2d may be symmetrical to each other with respect to the second axis AX2. The plurality of second cross portions 212P2d may face the first portion 211P1d. The plurality of second cross portions 212P2d may protrude from the first cross portion 212P1d. The plurality of second cross portions 212P2d may surround the plurality of second portions 211P2d. One of the plurality of second cross portions 212P2d may extend in the first cross direction DRa. Another second cross portion of the plurality of second cross portions 212P2d may extend in the second cross direction DRb.

The second cross pattern 212PT2d may be spaced apart from the first cross pattern 212PT1d with the first portion 211P1d therebetween. The second cross pattern 212PT2d may have a shape symmetrical with respect to the second axis AX2. The second cross pattern 212PT2d may include a third cross portion 212P3d and a plurality of fourth cross portions 212P4d. The third cross portion 212P3d and the plurality of fourth cross portions 212P4d may be provided to be integrated with each other.

The third cross portion 212P3d may extend in the second direction DR2.

The plurality of fourth cross portions 212P4d may be symmetrical with respect to the second axis AX2. The plurality of fourth cross portions 212P4d may face the first portion 211P1d. The plurality of fourth cross portions 212P4d may protrude from the third cross portion 212P3d. The plurality of fourth cross portions 212P4d may be adjacent to the plurality of third portions 211P3d, respectively. One of the plurality of fourth cross portions 212P4d may extend in the first cross direction DRa. Another fourth cross portion of the plurality of fourth cross portions 212P4d may extend in the second cross direction DRb.

The bridge pattern 212Bd may electrically connect the first cross pattern 212PT1d to the second cross pattern 212PT2d. The bridge pattern 212Bd may span across the first portion 211P1d in a plan view while remaining insulated from the first portion 211P1d.

According to some embodiments of the inventive concept, the plurality of second portions 211P2d, the plurality of second cross portions 212P2d, the plurality of third portions 211P3d, and the plurality of fourth cross portions 212P4d may be located adjacent to each other. The plurality of second portions 211P2d, the plurality of second cross portions 212P2d, the plurality of third portions 211P3d, and the plurality of fourth cross portions 212P4d may have a shape interdigitated with each other. A boundary on which the plurality of second portions 211P2d, the plurality of second cross portions 212P2d, the plurality of third portions 211P3d, and the plurality of fourth cross portions 212P4d face each other may increase in length. Thus, mutual capacitance between the electrode 211d and the cross electrode 212d may increase. Also, an amount of change in mutual capacitance before and after the input of the user's body 3000 (see FIG. 2) may increase. Thus, the sensing sensitivity of the sensor layer 200 may be improved.

When viewed on the plane, the outermost portion of an electrode area BD3 defined by the plurality of second portions 211P2d, the plurality of second cross portions 212P2d, the plurality of third portions 211P3d, and the plurality of fourth cross portions 212P4d define may have an octagonal shape. For example, the outermost portion of an area defined by the plurality of second cross portions 212P2d and the plurality of third portions 211P3d may have an octagonal shape.

According to some embodiments of the inventive concept, an area on which the electrode 211d and the cross electrode 212d cross or intersect each other while being insulated from each other may have an octagonal shape by the portions respectively extending in the first direction DR1, the second direction DR2, the first cross direction DRa, and the second cross direction DRb. A deviation in the interval between the electrode 211d and the cross electrode 212d may be reduced. Therefore, a deviation in amount of change in the mutual capacitance between the electrode 211d and the cross electrode 212d before and after the input of the user's body 3000 (see FIG. 2) according to the position of the user's body 3000 (see FIG. 2) may be reduced. Also, a deviation in amount of change in the mutual capacitance between each of the electrode 211d and the cross electrode 212d and the input device 2000 (see FIG. 2) before and after the sensing of the input device 2000 (see FIG. 2) according to the position of the input device 2000 (see FIG. 2) may be reduced. Thus, accuracy of each of the coordinates of the user's body 3000 (see FIG. 2), which are calculated using the sensor layer 200, and the coordinates of the input device 2000 (see FIG. 2) may be improved, and sensing reliability of the sensor layer 200 may be improved.

Figure 10:
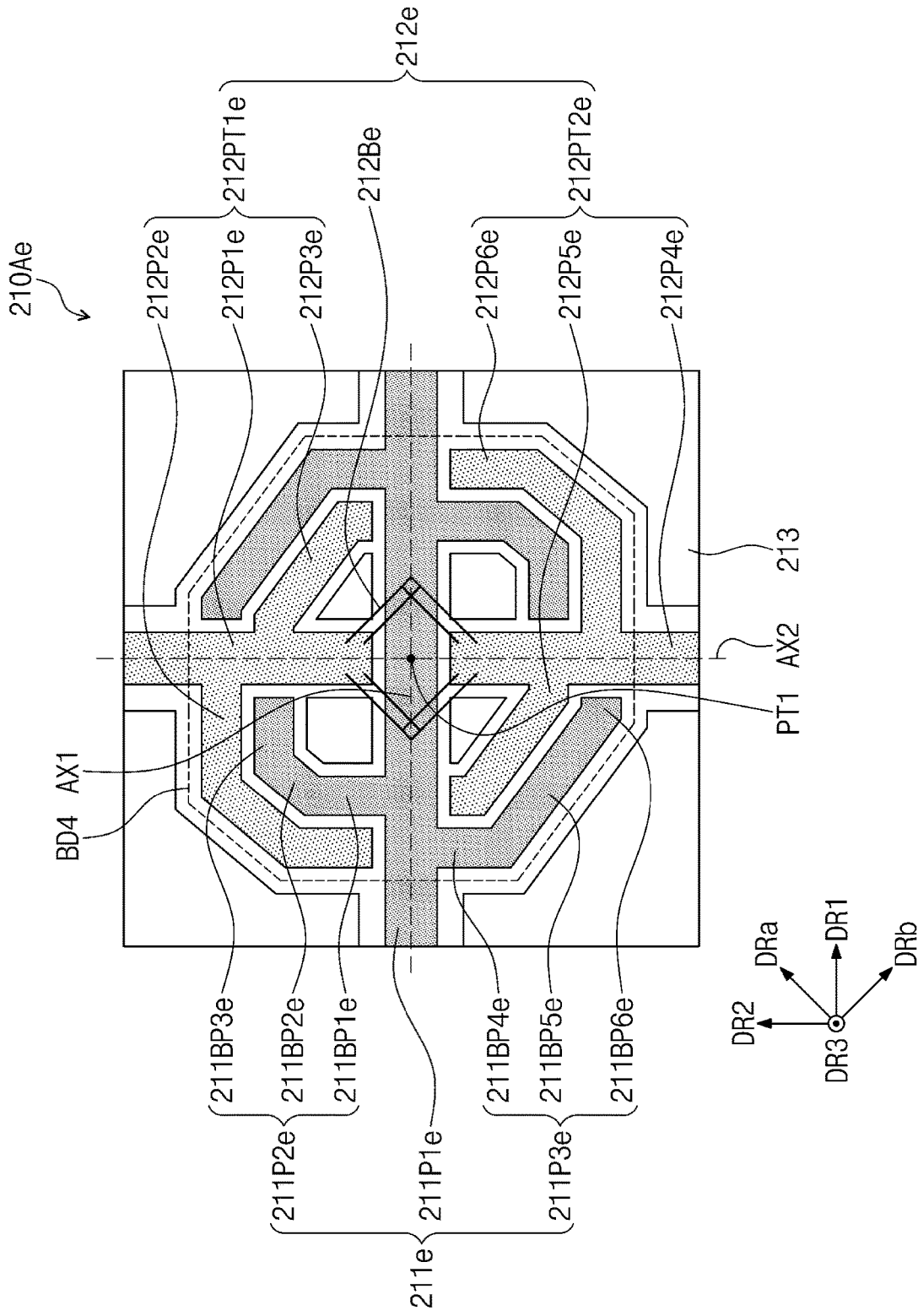

FIG. 10 is a plan view of the sub sensing unit according to some embodiments of the inventive concept. In description of FIG. 10, the same reference numerals are used for the components described in FIG. 5A, and descriptions thereof are omitted.

Referring to FIGS. 4 and 10, the plurality of sensing units 210 may include at least one sub sensing unit 210Ae. At least one sub sensing unit 210Ae may include an electrode 211e, an cross electrode 212e, and a plurality of dummy electrodes 213. A portion of the electrode 211e may be cross with a portion of the cross electrode 212e. The sensor layer 200 may acquire information on an external input through a change in mutual capacitance between the electrode 211e and the cross electrode 212e.

The electrode 211e may have a shape symmetrical with respect to a first point PT1 at which the first axis AX1 and the second axis AX2 cross each other. The electrode 211e may include a first portion 211P1e, a plurality of second portions 211P2e, and a plurality of third portions 211P3e. The first portion 211P1e, the plurality of second portions 211P2e, and the plurality of third portions 211P3e may be provided to be integrated with each other.

The first portion 211P1d may extend in the first direction DR1.

The plurality of second portions 211P2e may be point symmetrical with respect to the first point PT1. The plurality of second portions 211P2e may protrude from the first portion 211P1e. Each of the plurality of second portions 211P2e may include a first branch portion 211BP1e, a second branch portion 211BP2e, and a third branch portion 211BP3e. The first branch portion 211BP1e, the second branch portion 211BP2e, and the third branch portion 211BP3e may be provided to be integrated with each other.

The first branch portion 211BP1e may protrude from the first portion 211P1e. One end of the first branch portion 211BP1e may be adjacent to the first portion 211P1e, and the other end of the first branch portion 211BP1e may be adjacent to the second branch portion 211BP2e. The first branch portion 211BP1e may extend in the second direction DR2.

The second branch portion 211BP2e may protrude from the first branch portion 211BP1e. One end of the second branch portion 211BP2e may be adjacent to the first branch portion 211BP1e, and the other end of the second branch portion 211BP2e may be adjacent to the third branch portion 211BP3e. The second branch portion 211BP2e may extend in the first cross direction DRa.

The third branch portion 211BP3e may protrude from the second branch portion 211BP2e. One end of the third branch portion 211BP3e may be adjacent to the second branch portion 211BP2e, and the other end of the third branch portion 211BP3e may be adjacent to the first cross portion 212P1e. The third branch portion 211BP3e may extend in the first direction DR1.

The plurality of third portions 211P3e may be spaced apart from the plurality of second portions 211P2e, respectively, with the first portion 211P1e therebetween. The plurality of third portions 211P3e may surround the third cross portion 212P3e and the fifth cross portion 212P5e, respectively. The plurality of third portions 211P3e may be point symmetrical with respect to the first point PT1. The plurality of third portions 211P3e may protrude from the first portion 211P1e. Each of the plurality of third portions 211P3e may include a fourth branch portion 211BP4e, a fifth branch portion 211BP5e, and a sixth branch portion 211BP6e. The fourth branch portion 211BP4e, the fifth branch portion 211BP5e, and the sixth branch portion 211BP6e may be provided to be integrated with each other.

The fourth branch portion 211BP4e may protrude from the first portion 211P1e. One end of the fourth branch portion 211BP4e may be adjacent to the first portion 211P1e, and the other end of the fourth branch portion 211BP4e may be adjacent to the fifth branch portion 211BP5e. The fourth branch portion 211BP4e may extend in the second direction DR2.

The fifth branch portion 211BP5e may protrude from the fourth branch portion 211BP4e. One end of the fifth branch portion 211BP5e may be adjacent to the fourth branch portion 211BP4e, and the other end of the fifth branch portion 211BP5e may be adjacent to the sixth branch portion 211BP6e. The fifth branch portion 211BP5e may extend in the second cross direction DRb.

The sixth branch portion 211BP6e may protrude from the fifth branch portion 211BP5e. One end of the sixth branch portion 211BP6e may be adjacent to the fifth branch portion 211BP5e. The other end of the sixth branch portion 211BP6e may be adjacent to the fourth cross portion 212P4e. The sixth branch portion 211BP6e may extend in the first direction DR1.

The cross electrode 212e may include a first cross pattern 212PT1e, a second cross pattern 212PT2e, and a bridge pattern 212Be.

The first cross pattern 212PT1e may include a first cross portion 212P1e, a second cross portion 212P2e, and a third cross portion 212P3e. The first cross portion 212P1e, the second cross portion 212P2e, and the third cross portion 212P3e may be provided to be integrated with each other.

The first cross portion 212P1e may extend in the second direction DR2.

The second cross portion 212P2e may face the first portion 211P1e. The second cross portion 212P2e may protrude from the first cross portion 212P1e. The second cross portion 212P2e may surround one of the plurality of second portions 211P2e. The second cross portion 212P2e may extend in the first cross direction DRa.

The third cross portion 212P3e may be spaced apart from the second cross portion 212P2e with the first cross portion 212P1e therebetween. The third cross portion 212P3e may face the first portion 211P1e. The third cross portion 212P3e may protrude from the first cross portion 212P1e. The third cross portion 212P3e may extend in the second cross direction DRb.

The second cross pattern 212PT2e may be spaced apart from the first cross pattern 212PT1e with the first portion 211P1e therebetween. The first cross pattern 212PT1e and the second cross pattern 212PT2e may have a shape symmetrical to each other with respect to the first point PT1. The second cross pattern 212PT2e may include a fourth cross portion 212P4e, a fifth cross portion 212P5e, and a sixth cross portion 212P6e. The fourth cross portion 212P4e, the fifth cross portion 212P5e, and the sixth cross portion 212P6e may be provided to be integrated with each other.

The fourth cross portion 212P4e may extend in the second direction DR2.

The fifth cross portion 212P5e may face the first portion 211P1e. The fifth cross portion 212P5e may protrude from the fourth cross portion 212P4e. The fifth cross portion 212P5e may extend in the second cross direction DRb.

The sixth cross portion 212P6e may be spaced apart from the fifth cross portion 212P5e with the fourth cross portion 212P4e therebetween. The sixth cross portion 212P6e may face the first portion 211P1e. The sixth cross portion 212P6e may protrude from the fourth cross portion 212P4e. The sixth cross portion 212P6e may surround the other one of the plurality of second portions 211P2e. The sixth cross portion 212P6e may extend in the first cross direction DRa.

The bridge pattern 212Be may electrically connect the first cross pattern 212PT1e to the second cross pattern 212PT2e. The bridge pattern 212Bd may span across or intersect the first portion 211P1e in a plan view, while being insulated from the first portion 211P1e.

According to some embodiments of the inventive concept, the plurality of second portions 211P2e, the plurality of third portions 211P3e, the second cross portion 212P2e, the third cross portion 212P3e, the fourth cross portion 212P4e, and the fifth cross portions 212P5e may be located adjacent to each other. The plurality of second portions 211P2e, the plurality of third portions 211P3e, the second cross portion 212P2e, the third cross portion 212P3e, the fourth cross portion 212P4e, and the fifth cross portion 212P5e may have a shape interdigitated with each other. A boundary on which each of the plurality of second portions 211P2e, each of the plurality of third portions 211P3e, the second cross portion 212P2e, the third cross portion 212P3e, the fourth cross portion 212P4e, and the fifth cross portion 212P5e face each other may increase in length. Thus, mutual capacitance between the electrode 211e and the cross electrode 212e may increase. Also, an amount of change in mutual capacitance before and after the input of the user's body 3000 (see FIG. 2) may increase. Thus, the sensing sensitivity of the sensor layer 200 may be improved.

When viewed on the plane, the outer portion of the electrode area BD4, which is defined by the plurality of second portions 211P2e, the plurality of third portions 211P3e, the second cross portion 212P2e, the third cross portion 212P3e, the fourth cross portion 212P4e, and the fifth cross portion 212P5e may have an octagonal shape. For example, the outermost portion of an area defined by the plurality of third portions 211P3e, the second cross portion 212P2e, and the sixth cross portion 212P6e may have an octagonal shape.

According to some embodiments of the inventive concept, an area at which the electrode 211e and the cross electrode 212e cross or intersect while remaining insulated from each other may have an octagonal shape by the portions respectively extending in the first direction DR1, the second direction DR2, the first cross direction DRa, and the second cross direction DRb. A deviation in the interval between the electrode 211e and the cross electrode 212e may be reduced. Therefore, a deviation in amount of change in the mutual capacitance between the electrode 211e and the cross electrode 212e before and after the input of the user's body 3000 (see FIG. 2) according to the position of the user's body 3000 (see FIG. 2) may be reduced. Also, a deviation in amount of change in the mutual capacitance between each of the electrode 211e and the cross electrode 212e and the input device 2000 (see FIG. 2) before and after the sensing of the input device 2000 (see FIG. 2) according to the position of the input device 2000 (see FIG. 2) may be reduced. Thus, accuracy of each of the coordinates of the user's body 3000 (see FIG. 2), which are calculated using the sensor layer 200, and the coordinates of the input device 2000 (see FIG. 2) may be improved, and sensing reliability of the sensor layer 200 may be improved.

Figure 11:
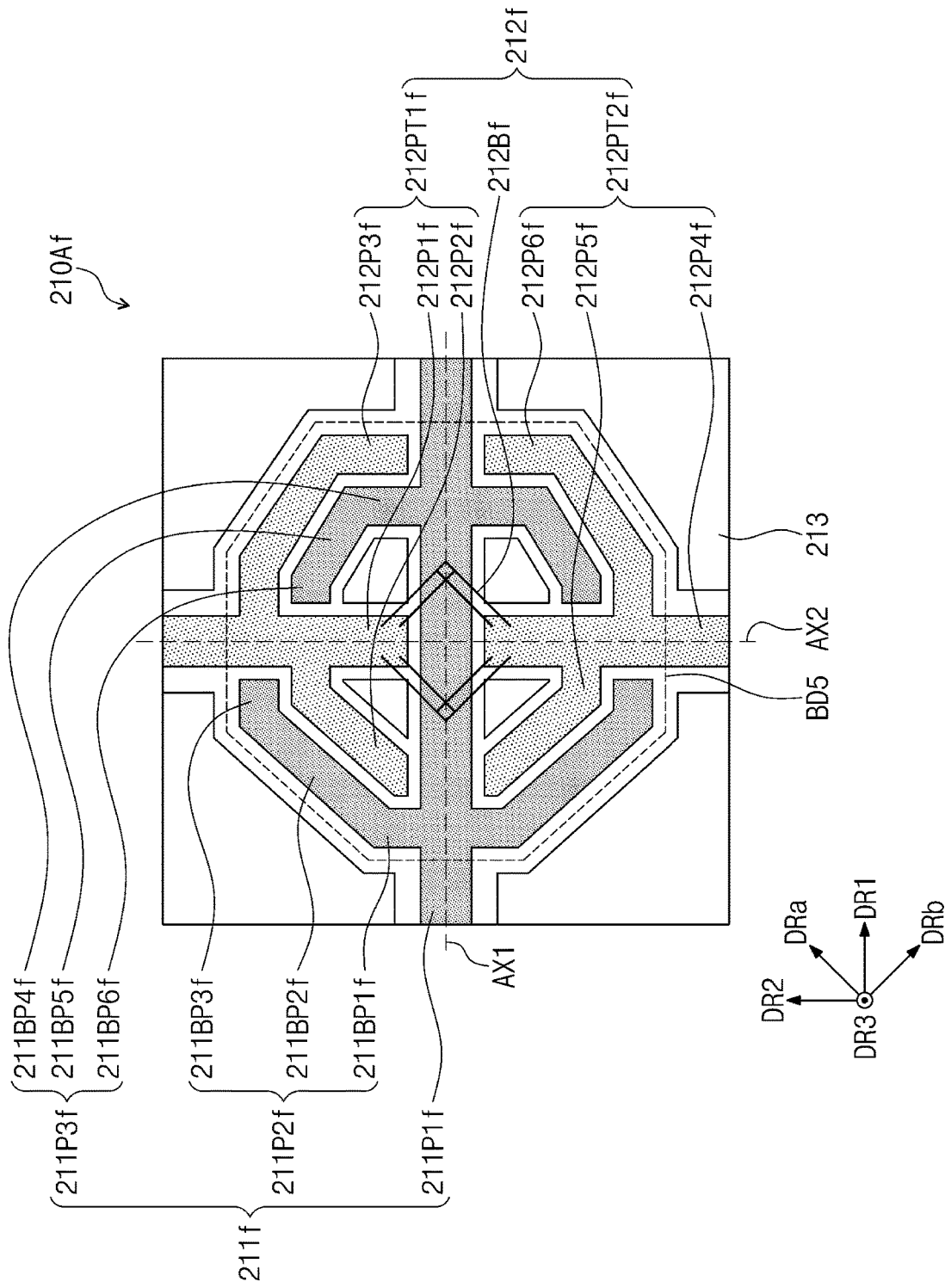

FIG. 11 is a plan view of the sub sensing unit according to some embodiments of the inventive concept. In description of FIG. 11, the same reference numerals are used for the components described in FIG. 5A, and descriptions thereof are omitted.

Referring to FIGS. 4 and 11, the plurality of sensing units 210 may include at least one sub sensing unit 210Af. At least one sub sensing unit 210Af may include an electrode 211f, an cross electrode 212f, and a plurality of dummy electrodes 213. The sensor layer 200 may acquire information on an external input through a change in mutual capacitance between the electrode 211f and the cross electrode 212f.

The electrode 211f may have a shape symmetrical with respect to the first axis AX1. The electrode 211f may include a first portion 211P1f, a plurality of second portions 211P2f, and a plurality of third portions 211P3f. The first portion 211P1f, the plurality of second portions 211P2f, and the plurality of third portions 211P3f may be provided to be integrated with each other.

The first portion 211P1f may extend in the first direction DR1.

The plurality of second portions 211P2f may be symmetrical to each other with respect to the first axis AX1. The plurality of second portions 211P2f may protrude from the first portion 211P1f. The plurality of second portions 211P2f may surround the second cross portion 212P2f and the fifth cross portion 212P5f, respectively. One second portion of the plurality of second portions 211P2f may extend in the first cross direction DRa. Another second portion of the plurality of second portions 211P2f may extend in the second cross direction DRb. The second portion 211P2f may include a first branch portion 211BP1f, a second branch portion 211BP2f, and a third branch portion 211BP3f. The first branch portion 211BP1f, the second branch portion 211BP2f, and the third branch portion 211BP3f may be provided to be integrated with each other.

The first branch portion 211BP1f may protrude from the first portion 211P1f. One end of the first branch portion 211BP1f may be adjacent to the first portion 211P1f, and the other end of the first branch portion 211BP1f may be adjacent to the second branch portion 211BP2f. The first branch portion 211BP1f may extend in the second direction DR2.

The second branch portion 211BP2f may protrude from the first branch portion 211BP1f. One end of the second branch portion 211BP2f may be adjacent to the first branch portion 211BP1f, and the other end of the second branch portion 211BP2f may be adjacent to the third branch portion 211BP3f. The second branch portion 211BP2f may extend in the first cross direction DRa or the second cross direction DRb.

The third branch portion 211BP3f may protrude from the second branch portion 211BP2f. One end of the third branch portion 211BP3f may be adjacent to the second branch portion 211BP2f, and the other end of the third branch portion 211BP3f may be adjacent to the first cross portion 212P1f. The third branch portion 211BP3f may extend in the first direction DR1.

The plurality of third portions 211P3f may be spaced apart from the plurality of second portions 211P2f, respectively, with the first cross portion 212P1f and the fourth cross portion 212P4f therebetween. The plurality of third portions 211P3f may be symmetrical with respect to the first axis AX1. The plurality of third portions 211P3f may protrude from the first portion 211P1f. Each of the plurality of third portions 211P3f may include a fourth branch portion 211BP4f, a fifth branch portion 211BP5f, and a sixth branch portion 211 BP6f. The fourth branch portion 211BP4f, the fifth branch portion 211BP5f, and the sixth branch portion 211BP6f may be provided to be integrated with each other.

The fourth branch portion 211BP4f may protrude from the first portion 211P1f. One end of the fourth branch portion 211BP4f may be adjacent to the first portion 211P1f, and the other end of the fourth branch portion 211BP4f may be adjacent to the fifth branch portion 211BP5f. The fourth branch portion 211BP4f may extend in the second direction DR2.

The fifth branch portion 211BP5f may protrude from the fourth branch portion 211BP4f. One end of the fifth branch portion 211BP5f may be adjacent to the fourth branch portion 211BP4f, and the other end of the fifth branch portion 211BP5f may be adjacent to the sixth branch portion 211BP6f. The fifth branch portion 211BP5f may extend in the first cross direction DRa or the second cross direction DRb.

The sixth branch portion 211BP6f may protrude from the fifth branch portion 211BP5f. One end of the sixth branch portion 211BP6f may be adjacent to the fifth branch portion 211BP5f, and the other end of the sixth branch portion 211BP6f may be adjacent to the first cross portion 212P1f. The sixth branch portion 211BP6f may extend in the first direction DR1.

The cross electrode 212f may include a first cross pattern 212PT1f, a second cross pattern 212PT2f, and a bridge pattern 212Bf.

The first cross pattern 212PT1f may include a first cross portion 212P1f, a second cross portion 212P2f, and a third cross portion 212P3f. The first cross portion 212P1f, the second cross portion 212P2f, and the third cross portion 212P3f may be provided to be integrated with each other.

The first cross portion 212P1f may extend in the second direction DR2.

The second cross portion 212P2f may face the first portion 211P1f. The second cross portion 212P2f may protrude from the first cross portion 212P1f. The second cross portion 212P2f may extend in the first cross direction DRa.

The third cross portion 212P3f may be spaced apart from the second cross portion 212P2f with the first cross portion 212P1f therebetween. The third cross portion 212P3f may face the first portion 211P1f. The third cross portion 212P3f may protrude from the first cross portion 212P1f. The third cross portion 212P3f may surround one of the plurality of third portions 211P3f. The third cross portion 212P3f may extend in the second cross direction DRb.

The second cross pattern 212PT2f may be spaced apart from the first cross pattern 212PT1f with the first portion 211P1f therebetween. The first cross pattern 212PT1f and the second cross pattern 212PT2f may have a shape symmetrical to each other with respect to the first axis AX1. The second intersection pattern 212PT2f may include a fourth cross portion 212P4f, a fifth cross portion 212P5f, and a sixth cross portion 212P6f. The fourth cross portion 212P4f, the fifth cross portion 212P5f, and the sixth cross portion 212P6f may be provided to be integrated with each other.

The fourth cross portion 212P4f may extend in the second direction DR2.

The fifth cross portion 212P5f may face the first portion 211P1f. The fifth cross portion 212P5f may protrude from the fourth cross portion 212P4f. The fifth cross portion 212P5f may extend in the second cross direction DRb.

The sixth cross portion 212P6f may be spaced apart from the fifth cross portion 212P5f with the fourth cross portion 212P4f therebetween. The sixth cross portion 212P6f may face the first portion 211P1f. The sixth cross portion 212P6f may protrude from the fourth cross portion 212P4f. The sixth cross portion 212P6f may surround another one of the plurality of third portions 211P3f. The sixth cross portion 212P6f may extend in the first cross direction DRa.

The bridge pattern 212Bf may electrically connect the first cross pattern 212PT1f to the second cross pattern 212PT2f. The bridge pattern 212Bf may span across or intersect the first portion 211P1f from a plan view while remaining insulated from the first portion 211P1f.

According to some embodiments of the inventive concept, the plurality of second portions 211P2f, the plurality of third portions 211P3f, the second cross portion 212P2f, the third cross portion 212P3f, the fifth cross portion 212P5f, and the sixth cross portions 212P6f may be located adjacent to each other. The plurality of second portions 211P2f, the plurality of third portions 211P3f, the second cross portion 212P2f, the third cross portion 212P3f, the fifth cross portion 212P5f, and the sixth cross portion 212P6f may have a shape interdigitated with each other. A boundary on which each of the plurality of second portions 211P2f, each of the plurality of third portions 211P3f, the second cross portion 212P2f, the third cross portion 212P3f, the fifth cross portion 212P5f, and the sixth cross portion 212P6f face each other may increase in length.

Accordingly, mutual capacitance between the electrode 211f and the cross electrode 212f may increase. Also, an amount of change in mutual capacitance before and after the input of the user's body 3000 (see FIG. 2) may increase. Thus, the sensing sensitivity of the sensor layer 200 may be improved.

When viewed on the plane, the outer portion of the electrode area BD5, which is defined by the plurality of second portions 211P2f, the plurality of third portions 211P3f, the second cross portion 212P2f, the third cross portion 212P3f, the fifth cross portion 212P5f, and the sixth cross portion 212P6f may have an octagonal shape. For example, the outermost portion of an area defined by the plurality of second portions 211P2f, the third cross portion 212P3f, and the sixth cross portion 212P6f may have an octagonal shape.

According to some embodiments of the inventive concept, an area on which the electrode 211f and the cross electrode 212f cross or intersect while remaining insulated from each other may have an octagonal shape by the portions respectively extending in the first direction DR1, the second direction DR2, the first cross direction DRa, and the second cross direction DRb. A deviation in the interval between the electrode 211f and the cross electrode 212f may be reduced. Therefore, a deviation in amount of change in the mutual capacitance between the electrode 211f and the cross electrode 212f before and after the input of the user's body 3000 (see FIG. 2) according to the position of the user's body 3000 (see FIG. 2) may be reduced. Also, a deviation in amount of change in the mutual capacitance between each of the electrode 211f and the cross electrode 212f and the input device 2000 (see FIG. 2) before and after the sensing of the input device 2000 (see FIG. 2) according to the position of the input device 2000 (see FIG. 2) may be reduced. Thus, accuracy of each of the coordinates of the user's body 3000 (see FIG. 2), which are calculated using the sensor layer 200, and the coordinates of the input device 2000 (see FIG. 2) may be improved, and sensing reliability of the sensor layer 200 may be improved.

Figure 12:
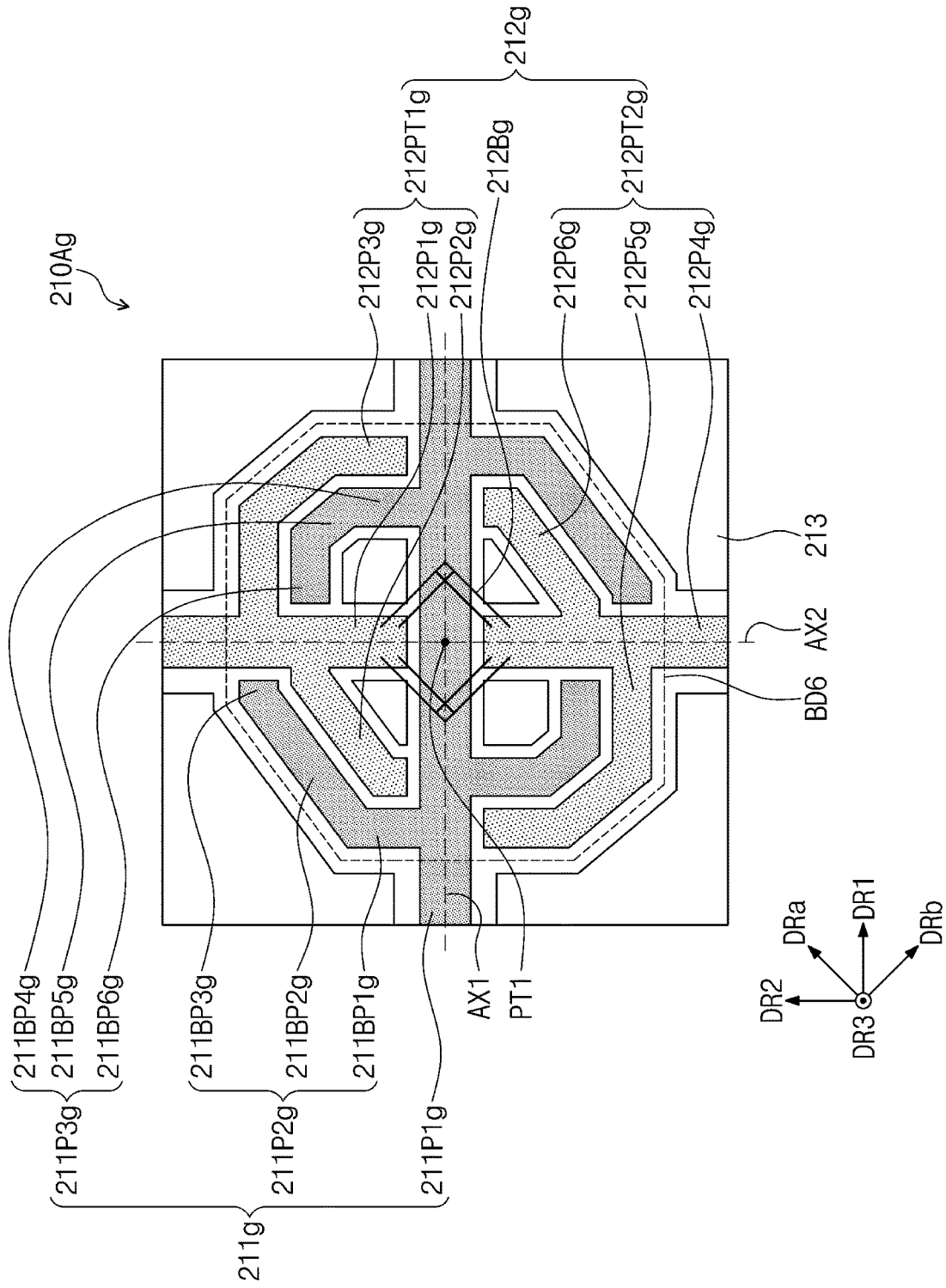

FIG. 12 is a plan view of the sub sensing unit according to some embodiments of the inventive concept. In description in FIG. 12, the same reference numerals are used for components described in FIG. 5A, and descriptions thereof are omitted.

Referring to FIGS. 4 and 12, the plurality of sensing units 210 may include at least one sub sensing unit 210Ag. At least one sub sensing unit 210Ag may include an electrode 211g, an cross electrode 212g, and a plurality of dummy electrodes 213. The sensor layer 200 may acquire information on an external input through a change in mutual capacitance between the electrode 211g and the cross electrode 212g.

The electrode 211g may have a shape symmetrical with respect to the first point PT1. The electrode 211g may include a first portion 211P1g, a plurality of second portions 211P2g, and a plurality of third portions 211P3g. The first portion 211P1g, the plurality of second portions 211P2g, and the plurality of third portions 211P3g may be provided to be integrated with each other.

The first portion 211P1g may extend in the first direction DR1.

The plurality of second portions 211P2g may be point symmetrical with respect to the first point PT1. The plurality of second portions 211P2g may protrude from the first portion 211P1g. The plurality of second portions 211P2g may surround the second cross portion 212P2g and the sixth cross portion 212P6g, respectively. Each of the plurality of second portions 211P2g may include a first branch portion 211BP1g, a second branch portion 211BP2g, and a third branch portion 211BP3g. The first branch portion 211BP1g, the second branch portion 211BP2g, and the third branch portion 211BP3g may be provided to be integrated with each other.

The first branch portion 211BP1g may protrude from the first portion 211P1g. One end of the first branch portion 211BP1g may be adjacent to the first portion 211P1g, and the other end of the first branch portion 211BP1g may be adjacent to the second branch portion 211BP2g. The first branch portion 211BP1g may extend in the second direction DR2.

The second branch portion 211BP2g may protrude from the first branch portion 211BP1g. One end of the second branch portion 211BP2g may be adjacent to the first branch portion 211BP1g, and the other end of the second branch portion 211BP2g may be adjacent to the third branch portion 211BP3g. The second branch portion 211BP2g may extend in the first cross direction DRa.

The third branch portion 211BP3g may protrude from the second branch portion 211BP2g. One end of the third branch portion 211BP3g may be adjacent to the second branch portion 211BP2g, and the other end of the third branch portion 211BP3g may be adjacent to the first cross portion 212P1g. The third branch portion 211BP3g may extend in the first direction DR1.

The plurality of third portions 211P3g may be spaced apart from the plurality of second portions 211P2g, respectively, with the first cross portion 212P1g and the fourth cross portion 212P4g therebetween. The plurality of third portions 211P3g may be point symmetrical with respect to the first point PT1. The plurality of third portions 211P3g may protrude from the first portion 211P1g. Each of the plurality of third portions 211P3g may include a fourth branch portion 211BP4g, a fifth branch portion 211BP5g, and a sixth branch portion 211BP6g. The fourth branch portion 211BP4g, the fifth branch portion 211BP5g, and the sixth branch portion 211BP6g may be provided to be integrated with each other.

The fourth branch portion 211BP4g may protrude from the first portion 211P1g. One end of the fourth branch portion 211BP4g may be adjacent to the first portion 211P1g, and the other end of the fourth branch portion 211BP4g may be adjacent to the fifth branch portion 211BP5g. The fourth branch portion 211BP4g may extend in the second direction DR2.

The fifth branch portion 211BP5g may protrude from the fourth branch portion 211BP4g. One end of the fifth branch portion 211BP5g may be adjacent to the fourth branch portion 211BP4g, and the other end of the fifth branch portion 211BP5g may be adjacent to the sixth branch portion 211BP6g. The fifth branch portion 211BP5g may extend in the second cross direction DRb.

The sixth branch portion 211BP6g may protrude from the fifth branch portion 211BP5g. One end of the sixth branch portion 211BP6g may be adjacent to the fifth branch portion 211BP5g, and the other end of the sixth branch portion 211BP6g may be adjacent to the first cross portion 212P1g. The sixth branch portion 211BP6g may extend in the first direction DR1.

The cross electrode 212g may include a first cross pattern 212PT1g, a second cross pattern 212PT2g, and a bridge pattern 212Bg.

The first cross pattern 212PT1g may include a first cross portion 212P1g, a second cross portion 212P2g, and a third cross portion 212P3g.

The first cross portion 212P1g may extend in the second direction DR2.

The second cross portion 212P2g may face the first portion 211P1g. The second cross portion 212P2g may protrude from the first cross portion 212P1g. The second cross portion 212P2g may extend in the first cross direction DRa.

The third cross portion 212P3g may be spaced apart from the second cross portion 212P2g with the first cross portion 212P1g therebetween. The third cross portion 212P3g may face the first portion 211P1g. The third cross portion 212P3g may protrude from the first cross portion 212P1g. The third cross portion 212P3g may surround one of the plurality of third portions 211P3g. The third cross portion 212P3g may extend in the second cross direction DRb.

The second cross pattern 212PT2g may be spaced apart from the first cross pattern 212PT1g with the first portion 211P1g therebetween. The first cross pattern 212PT1g and the second cross pattern 212PT2g may be point symmetrical with respect to the first point PT1. The second cross pattern 212PT2g may include a fourth cross portion 212P4g, a fifth cross portion 212P5g, and a sixth cross portion 212P6g. The fourth cross portion 212P4g, the fifth cross portion 212P5g, and the sixth cross portion 212P6g may be provided to be integrated with each other.

The fourth cross portion 212P4g may extend in the second direction DR2.

The fifth cross portion 212P5g may face the first portion 211P1g. The fifth cross portion 212P5g may protrude from the fourth cross portion 212P4g. The fifth cross portion 212P5g may surround another one of the plurality of third portions 211P3g. The fifth cross portion 212P5g may extend in the second cross direction DRb.

The sixth cross portion 212P6g may be spaced apart from the fifth cross portion 212P5g with the fourth cross portion 212P4g therebetween. The sixth cross portion 212P6g may face the first portion 211P1g. The sixth cross portion 212P6g may protrude from the fourth cross portion 212P4g. The sixth cross portion 212P6g may extend in the first cross direction DRa.

The bridge pattern 212Bg may electrically connect the first cross pattern 212PT1g to the second cross pattern 212PT2g. The bridge pattern 212Bg may cross or intersect the first portion 211P1g in a plan view while remaining insulated from the first portion 211P1g.

According to some embodiments of the inventive concept, the plurality of second portions 211P2g, the plurality of third portions 211P3g, the second cross portion 212P2g, the third cross portion 212P3g, the fifth cross portion 212P5g, and the sixth cross portions 212P6g may be located adjacent to each other. The plurality of second portions 211P2g, the plurality of third portions 211P3g, the second cross portion 212P2g, the third cross portion 212P3g, the fifth cross portion 212P5g, and the sixth cross portion 212P6g may have a shape interdigitated with each other. A boundary on which each of the plurality of second portions 211P2g, each of the plurality of third portions 211P3g, the second cross portion 212P2g, the third cross portion 212P3g, the fifth cross portion 212P5g, and the sixth cross portion 212P6g face each other may increase in length. Accordingly, mutual capacitance between the electrode 211g and the cross electrode 212g may increase. Also, an amount of change in mutual capacitance before and after the input of the user's body 3000 (see FIG. 2) may increase. Thus, the sensing sensitivity of the sensor layer 200 may be improved.

When viewed on the plane, the outer portion of the electrode area BD6, which is defined by the plurality of second portions 211P2g, the plurality of third portions 211P3g, the second cross portion 212P2g, the third cross portion 212P3g, the fourth cross portion 212P4g, and the fifth cross portion 212P5g may have an octagonal shape. For example, the outermost portion of an area defined by the plurality of second portions 211P2g, the third cross portion 212P3g, and the sixth cross portion 212P6g may have an octagonal shape.

According to some embodiments of the inventive concept, an area on which the electrode 211g and the cross electrode 212g cross or intersect each other while remaining insulated from each other may have an octagonal shape by the portions respectively extending in the first direction DR1, the second direction DR2, the first cross direction DRa, and the second cross direction DRb. A deviation of the interval between the electrode 211g and the cross electrode 212g may be reduced. Therefore, a deviation in amount of change in the mutual capacitance between the electrode 211g and the cross electrode 212g before and after the input of the user's body 3000 (see FIG. 2) according to the position of the user's body 3000 (see FIG. 2) may be reduced. Also, a deviation in amount of change in the mutual capacitance between each of the electrode 211g and the cross electrode 212g and the input device 2000 (see FIG. 2) before and after the sensing of the input device 2000 (see FIG. 2) according to the position of the input device 2000 (see FIG. 2) may be reduced. Thus, accuracy of each of the coordinates of the user's body 3000 (see FIG. 2), which are calculated using the sensor layer 200, and the coordinates of the input device 2000 (see FIG. 2) may be improved, and sensing reliability of the sensor layer 200 may be improved.

Figure 13:
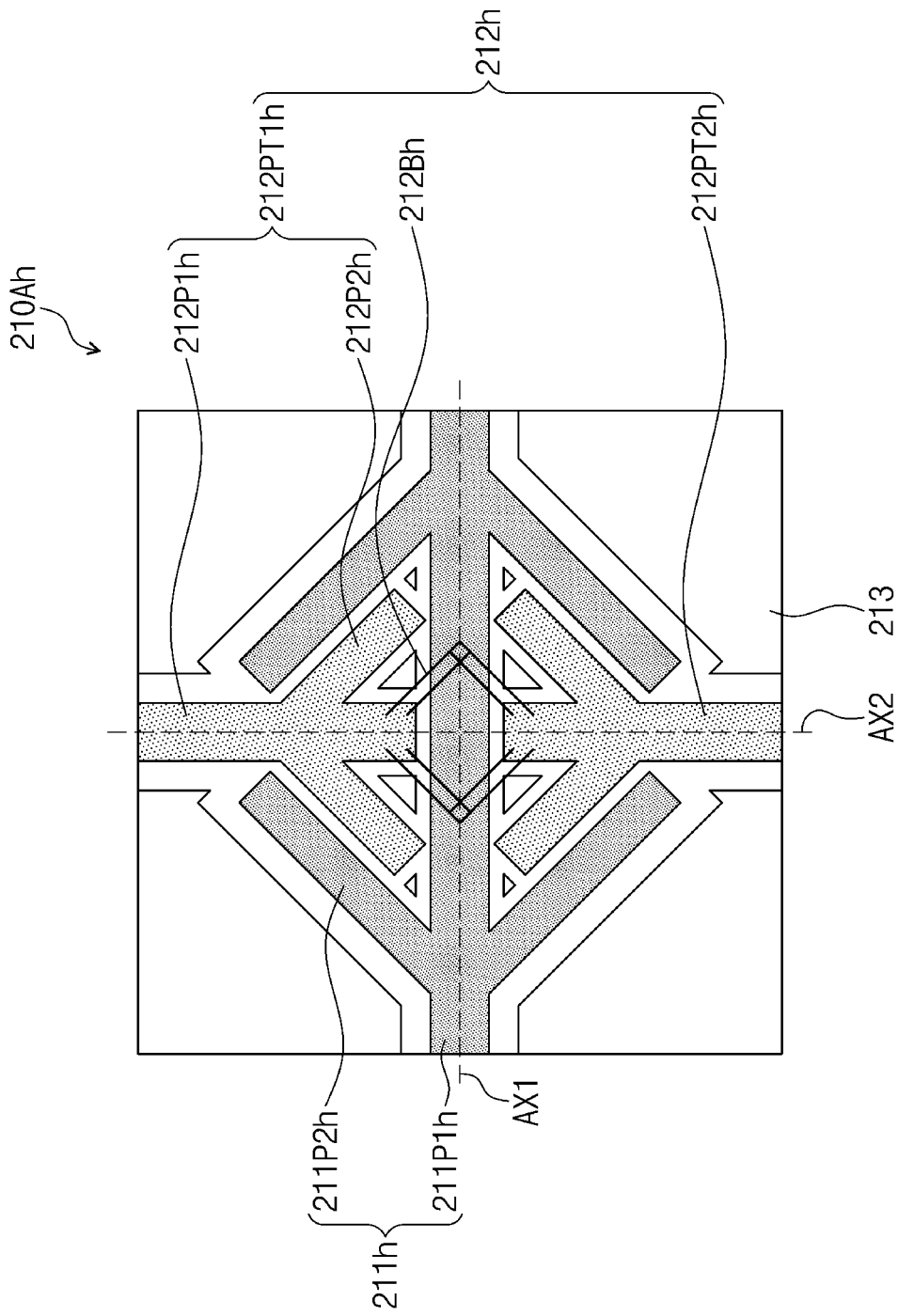

FIG. 13 is a plan view of the sub sensing unit according to some embodiments of the inventive concept. In description of FIG. 13, the same reference numerals are used for the components described in FIG. 5A, and descriptions thereof are omitted.

Referring to FIGS. 4 and 13, the plurality of sensing units 210 may include at least one sub sensing unit 210Ah. The at least one sub sensing unit 210Ah may include an electrode 211h, an cross electrode 212h, and a plurality of dummy electrodes 213. The sensor layer 200 may acquire information on an external input through a change in mutual capacitance between the electrode 211h and the cross electrode 212h.

The electrode 211h may have a shape symmetrical with respect to the first axis AX1 and the second axis AX2. The electrode 211h may include a first portion 211P1h and a plurality of second portions 211P2h. The first portion 211P1h and the plurality of second portions 211P2h may be provided to be integrated with each other.

The first portion 211P1h may extend in the first direction DR1.

The plurality of second portions 211P2h may be symmetrical to each other with respect to the first axis AX1 and the second axis AX2. The plurality of second portions 211P2h may protrude from the first portion 211P1h. The plurality of second portions 211P2h may surround the plurality of second cross portions 212P2h. Each of the plurality of second portions 211P2h may extend in a first cross direction DRa or a second cross direction DRb.

The cross electrode 212h may include a first cross pattern 212PT1h, a second cross pattern 212PT2h, and a bridge pattern 212Bh.

The first cross pattern 212PT1h may have a shape symmetrical with respect to the second axis AX2. The first cross pattern 212PT1h may include a first cross portion 212P1h and a plurality of second cross portions 212P2h.

The first cross portion 212P1h may extend in the second direction DR2.

The plurality of second cross portions 212P2h may face the first portion 211P1h. The plurality of second cross portions 212P2h may protrude from the first cross portion 212P1h. The plurality of second cross portions 212P2h may extend in the first cross direction DRa or the second cross direction DRb. The plurality of second cross portions 212P2h may be symmetrical to each other with respect to the second axis AX2.

The second cross pattern 212PT2h may be spaced apart from the first cross pattern 212PT1h with the first portion 211P1h therebetween. The first cross pattern 212PT1h and the second cross pattern 212PT2h may be symmetrical with respect to the first axis AX1.

The bridge pattern 212Bh may electrically connect the first cross pattern 212PT1h to the second cross pattern 212PT2h. The bridge pattern 212Bh may cross or intersect the first portion 211P1h while remaining insulated from the first portion 211P1h.

According to some embodiments of the inventive concept, the electrode 211h and the cross electrode 212h may be located adjacent to each other. The electrode 211h and the cross electrode 212h may have a shape interdigitated with each other. A boundary on which the electrode 211h and the cross electrode 212h face each other may increase in length. Accordingly, mutual capacitance between the electrode 211h and the cross electrode 212h may increase. Also, an amount of change in mutual capacitance before and after the input of the user's body 3000 (see FIG. 2) may increase. Thus, the sensing sensitivity of the sensor layer 200 may be improved.

Figure 14A:
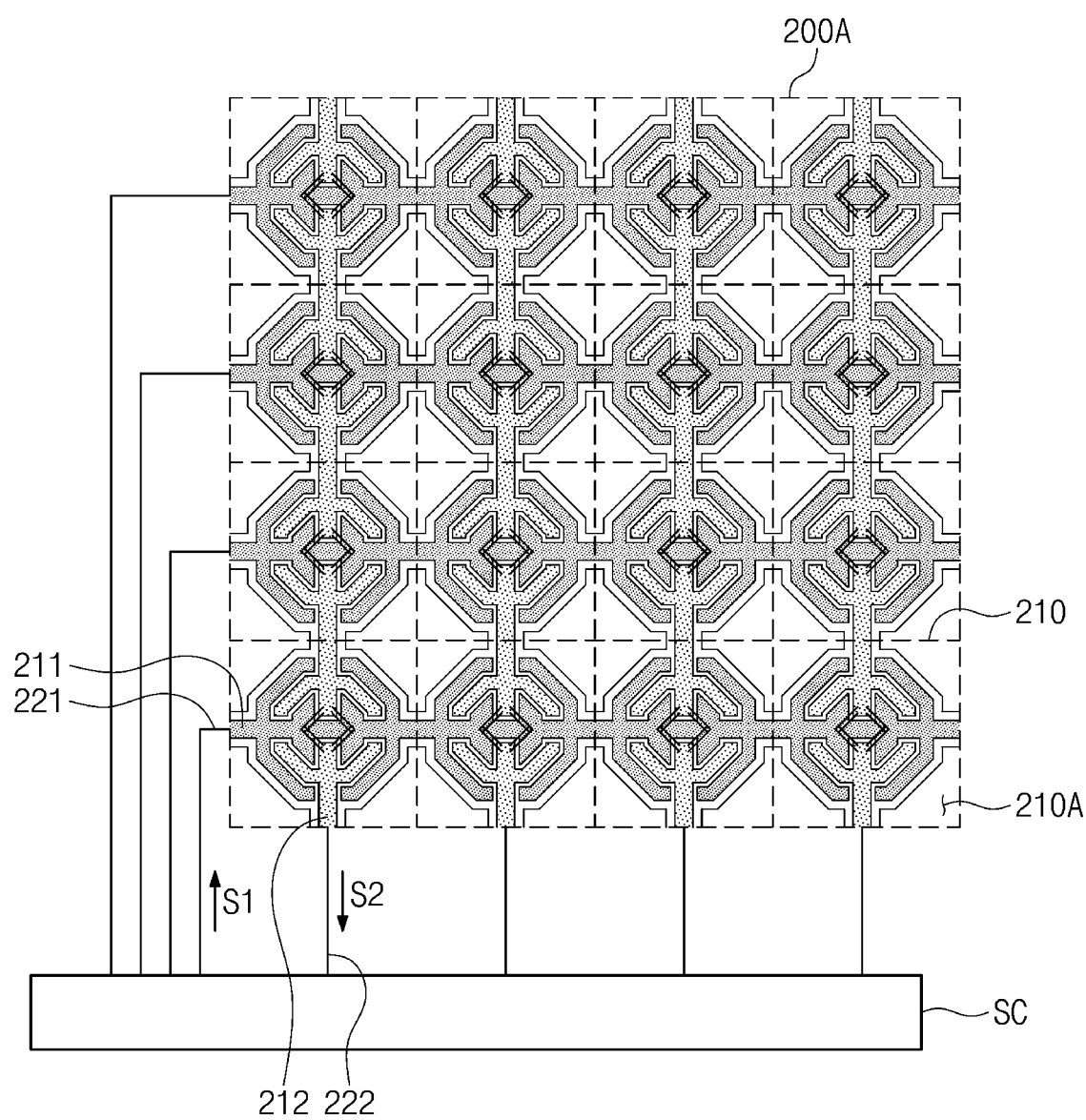
FIG. 14A is a view illustrating a sensor layer in a first mode according to some embodiments of the inventive concept.
Figure 14B:
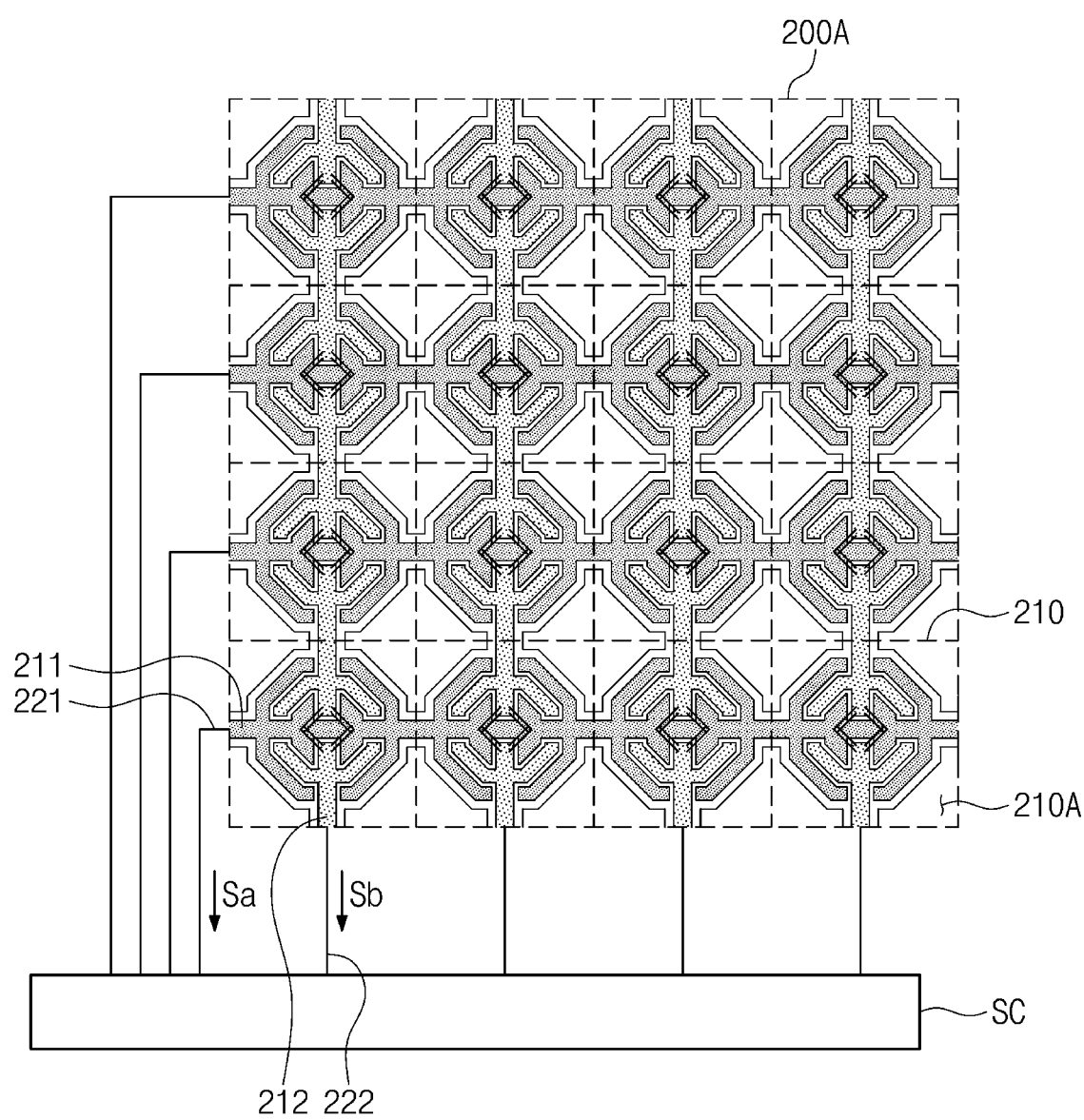
FIG. 14B is a view illustrating the sensor layer in a second mode according to some embodiments of the inventive concept.

FIG. 14A is a view illustrating the sensor layer in a first mode according to some embodiments of the inventive concept, and FIG. 14B is a view illustrating the sensor layer in a second mode according to some embodiments of the inventive concept.

Referring to FIGS. 14A and 14B, a plurality of sensing units 210 may be located on the active area 200A. FIGS. 14A and 14B illustrate 16 sensing units as an example, but the operation of the inventive concept is not limited by the number of sensing units. One sensing unit 210 may include at least one sub sensing unit 210A.

FIGS. 14A and 14B illustrate an example in which one sensing unit 210 includes one sub sensing unit 210A, the embodiments according to the inventive concept are not limited thereto.

In the first mode, each of the plurality of electrodes 211 may operate as a transmission electrode, and each of the plurality of cross electrodes 212 may operate as a reception electrode. However, this is merely an example. For example, the operations of the plurality of electrodes 211 and the plurality of cross electrodes 212 according to some embodiments of the inventive concept are not limited thereto. For example, in the first mode, each of the plurality of cross electrodes 212 may operate as a transmission electrode, and each of the plurality of electrodes 211 may operate as a reception electrode. In the first mode, a sensor driver SC may sense an external input by sensing a change in mutual capacitance generated between the electrode 211 and the cross electrode 212.

The plurality of lines 220 (see FIG. 4) may include a plurality of first lines 221 and a plurality of second lines 222. The plurality of first lines 221 may be electrically connected to the plurality of electrodes 211, respectively. The plurality of second lines 222 may be electrically connected to the plurality of cross electrodes 212.

In the first mode, the sensor driver SC may provide a driving signal S1 to the plurality of electrodes 211. In the first mode, the sensor driver SC may receive a sensing signal S2 from the plurality of cross electrodes 212. Thus, the sensor driver SC may acquire a coordinate value for a position at which an input is provided based on the amount of change in the sensing signals 51 and S2.

When the input device 2000 (see FIG. 2) approaches the sensor layer 200 (see FIG. 4), it may enter a second mode for sensing the sensor layer 200 (see FIG. 4). The input device 2000 (see FIG. 2) may transmit and receive data into and from the sensor driver SC through the sensor layer 200 (see FIG. 4).

In the second mode, each of the plurality of electrodes 211 and the plurality of cross electrodes 212 may be used as a reception electrode for providing signals Sa and Sb provided from the input device 2000 (see FIG. 2) to the sensor driver SC. In this case, the signals Sa and Sb may be referred to as downlink signals. However, this is merely an example. For example, the operations of the signals Sa and Sb according to some embodiments of the inventive concept are not limited thereto. For example, in the second mode, each of the plurality of electrodes 211 and the plurality of cross electrodes 212 may be used as a transmission electrode for providing the signals Sa and Sb provided from the sensor driver SC to the input device 2000 (see FIG. 2). In this case, the signals Sa and Sb may be referred to as uplink signals. That is, in the second mode, the plurality of electrodes 211 and the plurality of cross electrodes 212 may be used as mode transmission electrodes or mode reception electrodes.

Figure 14C:
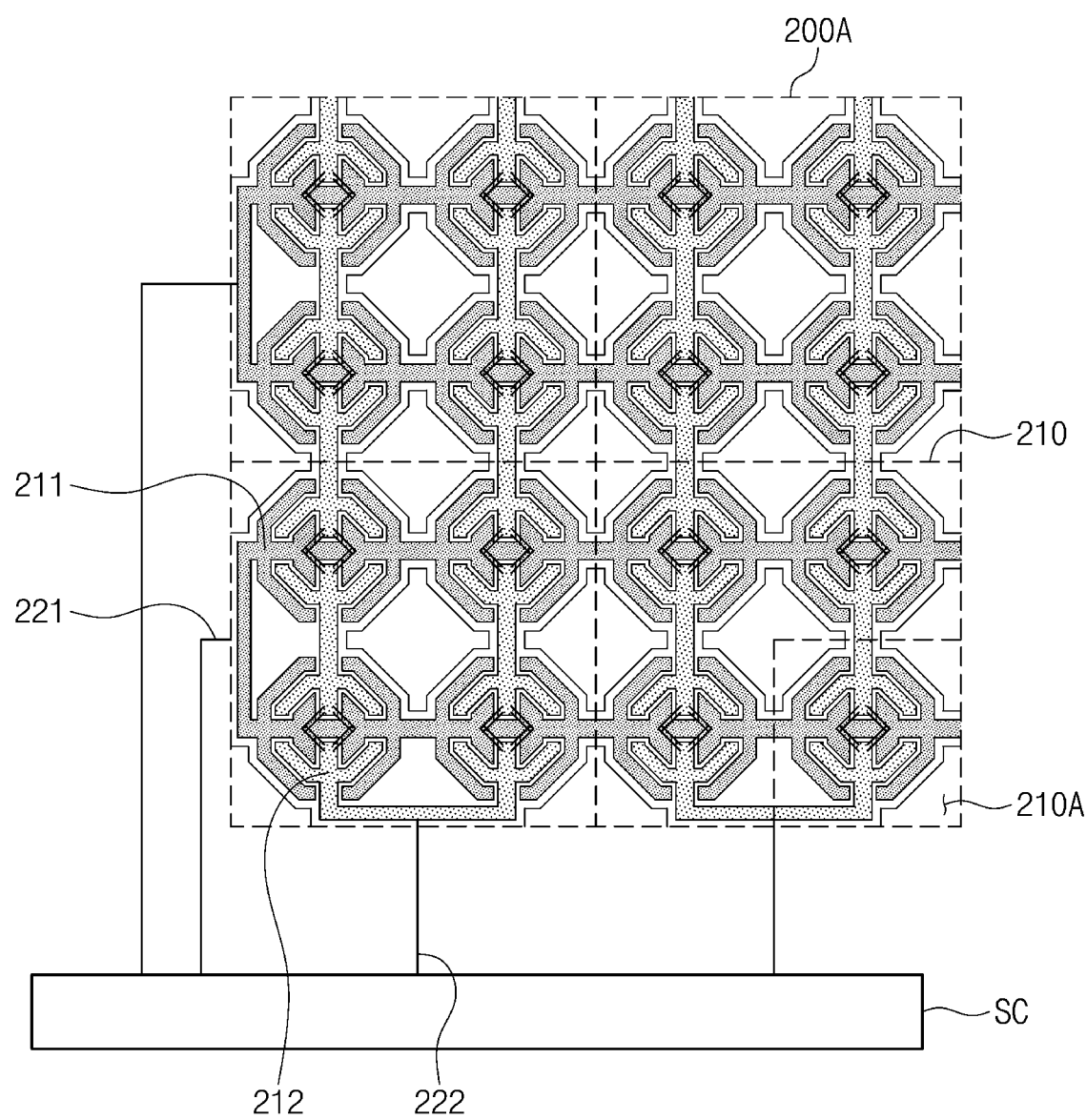
FIGS. 14C and 14D are views illustrating the sensing layer according to some embodiments of the inventive concept.

FIG. 14C is a plan view of the sensor layer according to some embodiments of the inventive concept.

Referring to FIGS. 4 and 14C, a plurality of sensing units 210 may be located on the active area 200A. One sensing unit 210 may include four sub sensing units 210Ai.

The plurality of lines 220 may include a plurality of first lines 221 and a plurality of second lines 222, which are electrically connected to the plurality of sub sensing units 210Ai. Each of the plurality of first lines 221 may be connected to two sub sensing units 210Ai, and each of the plurality of second lines 222 may be connected to two sub sensing units 210Ai.

According to some embodiments of the inventive concept, one line 220 may be connected to a plurality of sub sensing units 210Ai. Even if one sensing unit is divided into a plurality of sub sensing units, the number of lines required when providing a signal to the sensor layer 200 may be the same as the number of lines when one sensing unit is not divided into a plurality of sub sensing units. In this case, since an additional line is not required, a surface area of the peripheral area 200N may not increase. Therefore, it is possible to implement a narrow bezel.

Figure 14D:
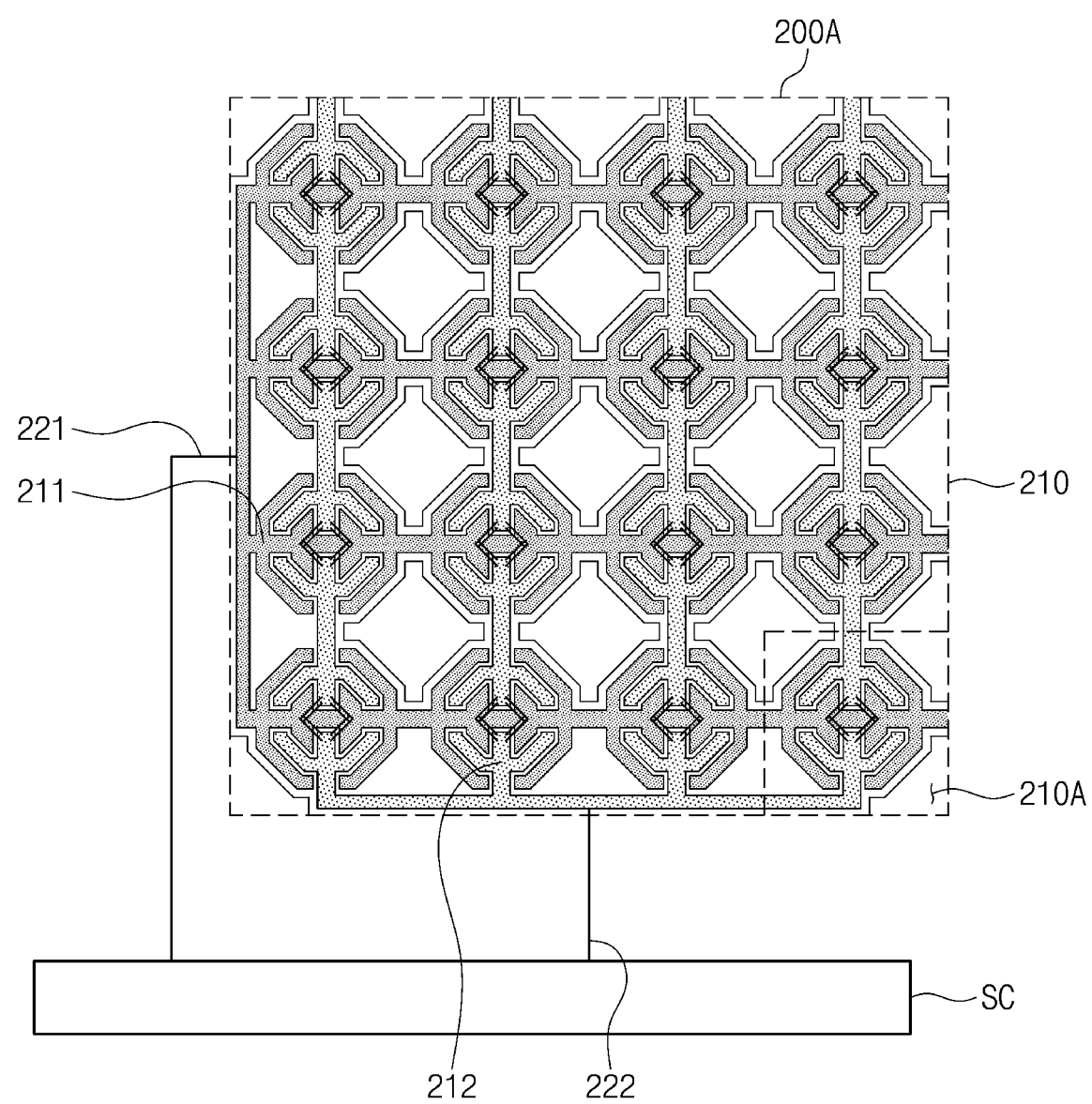

FIG. 14D is a plan view of the sensor layer according to some embodiments of the inventive concept.

Referring to FIGS. 4 and 14D, a plurality of sensing units 210 may be located on the active region 200A. One sensing unit 210 may include 16 sub sensing units 210Aj.

The plurality of lines 220 may include a plurality of first lines 221 and a plurality of second lines 222, which are electrically connected to the plurality of sub sensing units 210Aj. Each of the plurality of first lines 221 may be connected to four sub sensing units 210Aj. Each of the plurality of second lines 222 may be connected to four sub sensing units 210Aj.

According to some embodiments of the inventive concept, one line 220 may be connected to the plurality of sub sensing units 210Aj. Even if one sensing unit is divided into a plurality of sub sensing units, the number of lines required when providing a signal to the sensor layer 200 may be the same as the number of lines when one sensing unit is not divided into a plurality of sub sensing units. In this case, since an additional line is not required, a surface area of the peripheral area 200N may not increase. Therefore, it is possible to implement a narrow bezel.

According to some embodiments of the inventive concept, the electronic device may include the display layer and the sensor layer. The sensor layer may include the electrode and the cross electrode. The electrode and the cross electrode may be located adjacent to each other. A portion of the electrode and a portion of the cross electrode may have the shape interdigitated with each other. The boundary on which a portion of the electrode and a portion of the cross electrode face each other may increase in length. Therefore, the mutual capacitance between the electrode and the cross electrode may increase. In addition, the amount of change in mutual capacitance before and after the user's input may increase. Therefore, the sensing sensitivity of the sensor layer may be improved.

According to some embodiments of the inventive concept, the area on which the electrode and the cross electrode cross or intersect each other in a plan view while remaining insulated from each other may have the octagonal shape by the portions that respectively extend in the first direction, the second direction, the first cross direction, and the second cross direction. A deviation in interval between the electrode and the cross electrode may be reduced. The deviation in amount of change in mutual capacitance between the electrode and the cross electrode before and after the user's input according to the position of the user's input may be reduced. In addition, the deviation in amount of change in capacitance between each of the electrode and the cross electrode and the input device may be reduced. Therefore, the accuracy of each of the coordinates of the user's input calculated using the sensor layer and the coordinates of the input device may be improved, and the sensing reliability of the sensor layer may be improved.

It will be apparent to those skilled in the art that various modifications and deviations can be made in the inventive concept. Thus, it is intended that the present disclosure covers the modifications and deviations of this invention provided they come within the scope of the appended claims and their equivalents. Hence, the real protective scope of the inventive concept shall be determined by the technical scope of the accompanying claims and their equivalents.

What is claimed is:

1. An electronic device comprising:
a display layer; and
a sensor layer on the display layer, the sensor layer having an active area and a peripheral area adjacent to the active area and comprising a plurality of sensing units on the active area and a plurality of lines on the peripheral area,
wherein each of the plurality of sensing units comprises at least one sub sensing unit,
the at least one sub sensing unit comprises:
a first pattern comprising a first portion and a second portion protruding from the first portion;
a first cross pattern comprising a first cross portion and a second cross portion protruding from the first cross portion;
a second cross pattern spaced apart from the first cross pattern with the first portion therebetween; and
a bridge pattern electrically connected to the first cross pattern and the second cross pattern, wherein the bridge pattern crosses the first portion in a plan view and is insulated from the first portion,
wherein a first axis, which is an axis of the first portion, extends in a first direction,
a second axis, which is an axis of the first cross portion, extends in a second direction crossing the first direction, such that the first axis and the second axis intersect at a center of the at least one sub sensing unit,
the second portion has a first branch portion that branches off the first portion and extends in a first cross direction crossing the first direction and a second branch portion that branches off the first branch portion and extends in the second direction toward the first cross portion, and
the second cross portion extends in the first cross direction to face the first portion.

2. The electronic device of claim 1, wherein the second portion is provided in plural, and the plurality of second portions surround a plurality of second cross portions, respectively.

3. The electronic device of claim 1, wherein the first pattern has a shape in which a shape symmetrical with respect to the first axis extending in the first direction is symmetrical with the second axis extending in the second direction,
the first cross pattern has a shape symmetrical with respect to the second axis, and
the first cross pattern and the second cross pattern have shapes symmetrical to each other with respect to the first axis.

4. The electronic device of claim 3, wherein the first pattern further comprises a third portion protruding from the first portion in the second direction, and
the second portion further comprises:
the first branch portion adjacent to the first portion and extending in the second direction;
the second branch portion adjacent to the first branch portion and extending in the first cross direction; and
a third branch portion adjacent to the second branch portion, facing the first cross portion, and extending in the first direction.

5. The electronic device of claim 4, wherein the second cross portion is between the second portion and the third portion.

6. The electronic device of claim 3, wherein the first cross pattern further comprises a third cross portion protruding from the first cross portion in the first direction, and
the second cross portion comprises:
a first cross branch portion adjacent to the first cross portion and extending in the first direction;
a second cross branch portion adjacent to the first cross branch portion and extending in the first cross direction; and
a third cross branch portion adjacent to the second cross branch portion, facing the first portion, and extending in the second direction.

7. The electronic device of claim 6, wherein the second portion is between the second cross portion and the third cross portion.

8. The electronic device of claim 1, wherein the first pattern further comprises a third portion spaced apart from the second portion with the first cross pattern therebetween and protruding from the first portion,
the second portion comprises:
the first branch portion adjacent to the first portion and extending in the second direction;
the second branch portion adjacent to the first branch portion and extending in the first cross direction; and
a third branch portion adjacent to the second branch portion, facing the first cross portion, and extending in the first direction, and
the third portion comprises:
a fourth branch portion adjacent to the first portion and extending in the second direction;
a fifth branch portion adjacent to the fourth branch portion and extending in a second cross direction crossing the first cross direction; and
a sixth branch portion adjacent to the fifth branch portion and extending in the first direction.

9. The electronic device of claim 8, wherein the first cross pattern further comprises a third cross portion protruding from the first cross portion, and
the second portion surrounds the second cross portion, and the third cross portion surrounds the third portion.

10. The electronic device of claim 9, wherein the first pattern has a shape symmetrical with respect to the first axis extending in the first direction, and
the first cross pattern and the second cross pattern have shapes symmetrical to each other with respect to the first axis.

11. The electronic device of claim 9, wherein the first pattern has a shape that is point symmetrical with respect to a first point at which the first axis extending in the first direction and the second axis extending in the second direction cross each other, and
the first cross pattern and the second cross pattern have shape symmetrical to each other with respect to the first point.

12. The electronic device of claim 1, wherein the first pattern further comprises a third portion spaced apart from the second portion with the first pattern therebetween and protruding from the first portion,
the second portion comprises:
the first branch portion adjacent to the first portion and extending in the second direction;
the second branch portion adjacent to the first branch portion and extending in the first cross direction; and
a third branch portion adjacent to the second branch portion and extending in the first direction, and
the third portion comprises:
a fourth branch portion adjacent to the first portion and extending in the second direction;
a fifth branch portion adjacent to the fourth branch portion and extending in a second cross direction crossing the first cross direction; and a sixth branch portion adjacent to the fifth branch portion and extending in the first direction.

13. The electronic device of claim 12, wherein the second cross pattern comprises a third cross portion extending in the second direction and spaced apart from the first cross portion with the first portion therebetween and a fourth cross portion protruding from the third cross portion, and the second cross portion surrounds the second portion, and the third portion surrounds the fourth cross portion.

14. The electronic device of claim 13, wherein each of the first pattern, the first cross pattern, and the second cross pattern has a shape symmetrical with respect to the second axis extending in the second direction.

15. The electronic device of claim 13, wherein the first pattern has a shape that is point symmetrical with respect to a first point at which the first axis extending in the first direction and the second axis extending in the second direction cross each other, and the first cross pattern and the second cross pattern have shapes symmetrical to each other with respect to the first point.

16. The electronic device of claim 1, wherein the first pattern, the first cross pattern, the second cross pattern, and the bridge pattern have a mesh structure.

17. The electronic device of claim 1, wherein the at least one sub sensing unit is provided in plurality, and the plurality of lines comprise a first line and a second line, which are electrically connected to the plurality of sub sensing units.

18. The electronic device of claim 17, wherein the first line is electrically connected to the first pattern, and the second line is electrically connected to the first cross pattern, the second cross pattern, and the bridge pattern.

19. An electronic device comprising:

a display layer; and a sensor layer on the display layer, the sensor layer having active area and a peripheral area adjacent to the active area, the sensor layer comprising a plurality of sensing units on the active area and a plurality of lines on the peripheral area, wherein the sensor layer is configured to sense an input of an input device, wherein each of the plurality of sensing units comprises at least one sub sensing unit, the at least one sub sensing unit comprises:

an electrode comprising:

a first portion having a first axis extending in a first direction; and a plurality of second portions protruding from the first portion; and a cross electrode comprising:

a plurality of first cross portions having a second axis extending in a second direction crossing the first direction, direction, such that the first axis and the second axis intersect at a center of the at least one sub sensing unit;

a plurality of second cross portions respectively protruding from the plurality of first cross portions; and a bridge pattern insulated from the first portion, each of the plurality of second portions comprises:

a first branch portion extending in the second direction;

a second branch portion extending from the first branch portion and extending in a cross direction crossing the first direction and the second direction; and a third branch portion extending from the second branch portion and extending in the first direction, and the sensor layer is configured to sense the input by touch through a change in mutual capacitance generated between the electrode and the cross electrode and senses an input by the input device through a change in capacitance of each of the electrode and the cross electrode.

20. The electronic device of claim 19, wherein each of the plurality of sensing units comprises a plurality of sub sensing units, the plurality of lines comprise a first line and a second line, the first line is electrically connected to each of the plurality of sub sensing units, and the second line is electrically connected to the cross electrode of each of the plurality of sub sensing units.

21. The electronic device of claim 19, wherein the outermost portion of an electrode area defined by the plurality of second portions and the plurality of second cross portions has an octagonal shape in a plan view.

22. The electronic device of claim 19, wherein the second branch portion of each of the plurality of second portions is adjacent to each of the plurality of second cross portions.

23. The electronic device of claim 19, wherein each of the electrode and the cross electrode has a shape symmetrical with respect to the first axis extending in the first direction.

24. The electronic device of claim 19, wherein each of the electrode and the cross electrode have a shape that is symmetrical with respect to the second axis extending in the second direction.

25. The electronic device of claim 19, wherein each of the first electrode and the cross electrode have a shape that is point symmetrical with respect to a first point at which the first axis extending in the first direction and the second axis extending in the second direction cross each other.

* * * * *

UNITED STATES PATENT AND TRADEMARK OFFICE
CERTIFICATE OF CORRECTION

| | | |
|---|---|---|
| PATENT NO. | : 11,460,967 B2 | Page 1 of 1 |
| APPLICATION NO. | : 17/210753 | |
| DATED | : October 4, 2022 | |
| INVENTOR(S) | : Minsoo Kim et al. | |

It is certified that error appears in the above-identified patent and that said Letters Patent is hereby corrected as shown below:

In the Claims

In Column 38, Lines 3-4, in Claim 19, after "first" delete "direction,".

Signed and Sealed this
Nineteenth Day of December, 2023

*Katherine Kelly Vidal*

Katherine Kelly Vidal
*Director of the United States Patent and Trademark Office*